(12) United States Patent
Wada et al.

(10) Patent No.: US 12,312,452 B2
(45) Date of Patent: May 27, 2025

(54) RESIN COMPOSITION, PREPREG, FILM WITH RESIN, METAL FOIL WITH RESIN, METAL-CLAD LAMINATE, AND WIRING BOARD

(71) Applicant: PANASONIC INTELLECTUAL PROPERTY MANAGEMENT CO., LTD., Osaka (JP)

(72) Inventors: Atsushi Wada, Osaka (JP); Masashi Koda, Fukushima (JP); Ryusei Kozawa, Osaka (JP); Yuki Kitai, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 587 days.

(21) Appl. No.: 17/762,636

(22) PCT Filed: Sep. 18, 2020

(86) PCT No.: PCT/JP2020/035431
§ 371 (c)(1),
(2) Date: Mar. 22, 2022

(87) PCT Pub. No.: WO2021/060178
PCT Pub. Date: Apr. 1, 2021

(65) Prior Publication Data
US 2022/0356279 A1 Nov. 10, 2022

(30) Foreign Application Priority Data
Sep. 27, 2019 (JP) .................. 2019-177945

(51) Int. Cl.
C08G 65/329 (2006.01)
B32B 15/08 (2006.01)
B32B 27/20 (2006.01)
B32B 27/28 (2006.01)
C08F 212/08 (2006.01)
C08F 212/36 (2006.01)
C08G 65/26 (2006.01)
C08J 5/24 (2006.01)
C08K 3/36 (2006.01)
C08K 5/01 (2006.01)
C08K 5/3415 (2006.01)
C08K 5/3432 (2006.01)
C08K 7/14 (2006.01)

(52) U.S. Cl.
CPC .............. *C08J 5/244* (2021.05); *B32B 15/08* (2013.01); *B32B 27/20* (2013.01); *B32B 27/28* (2013.01); *C08F 212/08* (2013.01); *C08F 212/36* (2013.01); *C08G 65/2612* (2013.01); *C08G 65/329* (2013.01); *C08J 5/249* (2021.05); *C08K 3/36* (2013.01); *C08K 5/01* (2013.01); *C08K 5/3415* (2013.01); *C08K 5/3432* (2013.01); *C08K 7/14* (2013.01); *B32B 2250/03* (2013.01); *B32B 2311/12* (2013.01); *B32B 2311/24* (2013.01); *B32B 2325/00* (2013.01); *B32B 2371/00* (2013.01); *B32B 2457/08* (2013.01)

(58) Field of Classification Search
CPC ................................... C08L 25/08; C08K 5/32
See application file for complete search history.

(56) References Cited

U.S. PATENT DOCUMENTS

| | | | |
|---|---|---|---|
| 6,136,951 A | 10/2000 | Benage et al. | |
| 2007/0129502 A1 † | 6/2007 | Kawabe | |
| 2010/0218887 A1 * | 9/2010 | Vreeland | B41M 7/0027 |
| | | | 428/32.52 |
| 2019/0284442 A1 * | 9/2019 | Watanabe | H01L 23/562 |
| 2020/0010675 A1 | 1/2020 | Yamatsu et al. | |
| 2021/0108173 A1 | 4/2021 | Kawabe et al. | |

FOREIGN PATENT DOCUMENTS

| | | | | |
|---|---|---|---|---|
| CN | 1914239 A | 2/2007 | | |
| CN | 1914239 B | 5/2010 | | |
| CN | 109563218 A | 4/2019 | | |
| JP | 2003-507496 A | 2/2003 | | |
| JP | 2008-239781 A | 10/2008 | | |
| JP | 2014-169360 A | 9/2014 | | |
| JP | 2018028078 A † | 2/2018 | | |
| JP | 2018-168347 * | 11/2018 | | |
| JP | 2018-168347 A | 11/2018 | | |
| TW | 2013-19146 A1 | 5/2013 | | |
| WO | 2013069077 A1 † | 5/2013 | | |
| WO | 2017/115813 A1 | 7/2017 | | |
| WO | WO-2018030113 A1 * | 2/2018 | | B32B 27/308 |
| WO | 2018/181842 A1 | 10/2018 | | |

OTHER PUBLICATIONS

OTHER PUBLICATIONS

Translation of JP 2018-168347 (Year: 2018).*
Polymer Chemistry and Technology, Chemical Industry Press, 1st Edition, (1991), p. 211, partial translation.
Polymer Physics, Chengdu University of Science and Technology Press, 1st Ed., (1990), p. 315 partial translation.
ISR issued in International Patent Application No. PCT/JP2020/035431, Dec. 22, 2020, translation.

* cited by examiner
† cited by third party

*Primary Examiner* — Robert C Boyle
(74) *Attorney, Agent, or Firm* — GREENBLUM & BERNSTEIN, P.L.C.

(57) ABSTRACT

An aspect of the present application relates to a resin composition, which contains a polymer having a structural unit represented by Formula (1) in a molecule and a free radical compound and in which the free radical compound has at least one free radical group selected from the group consisting of structures represented by Formulas (2), (3), (4) and (5) in the molecule.

24 Claims, 5 Drawing Sheets ic FIELD

RESIN COMPOSITION, PREPREG, FILM WITH RESIN, METAL FOIL WITH RESIN, METAL-CLAD LAMINATE, AND WIRING BOARD

TECHNICAL FIELD

The present invention relates to a resin composition, a prepreg, a film with resin, a metal foil with resin, a metal-clad laminate, and a wiring board.

BACKGROUND ART

As the information processing quantity by various kinds of electronic equipment increases, mounting technologies such as high integration of semiconductor devices to be mounted, densification of wiring, and multilayering are progressing. In addition, wiring boards to be used in various kinds of electronic equipment are required to be, for example, high-frequency compatible wiring boards such as a millimeter-wave radar board for in-vehicle use. Wiring boards to be used in various kinds of electronic equipment are required to decrease the loss during signal transmission in order to increase the signal transmission speed, and this is especially required for high-frequency wiring boards. In order to meet this requirement, substrate materials for forming substrates of wiring boards to be used in various kinds of electronic equipment are required to have a low dielectric constant and a low dielectric loss tangent.

As such substrate materials, for example, a curable composition containing a soluble polyfunctional vinyl aromatic copolymer and a radical polymerization initiator was reported (Patent Literature 1).

According to Patent Literature 1, it is disclosed that a material can be obtained which is equipped with low dielectric properties and applicable to the advanced electrical and electronic fields in which high-performance electrical properties, thermal and mechanical properties are required. It is considered that a wiring board obtained by using a resin composition of which the dielectric properties such as dielectric constant and dielectric loss tangent are low as described in Patent Literature 1 can decrease the loss during signal transmission.

On the other hand, wiring boards are required to exhibit dielectric properties that do not deteriorate when the wiring boards are used for a long period of time as well. In order that the dielectric properties of wiring boards do not deteriorate for a long period of time, it is necessary that the electrical properties (dielectric loss tangent in Examples) of the cured product forming the wiring boards do not change.

Generally, as a method for observing changes in electrical properties over a long period of time, there is a test in which the wiring board is treated in a thermal environment, and it is required that there are little changes in electrical properties of the cured product in a thermal environment as well.

Substrates of wiring boards are required to maintain the low dielectric properties even if they absorb water so that the wiring boards can be used even in an environment in which the humidity is high.

In other words, substrate materials for forming substrates of wiring boards are also required to exhibit dielectric properties that are not affected by high temperatures, water absorption and the like so that the wiring boards can also be used in an environment in which the temperature is high and an environment in which the humidity is high.

For application to wiring boards, especially multilayer laminated wiring boards, it is necessary to fill the circuit pattern (between wirings) with a substrate material (insulating layer molding material), and it is thus required to secure sufficient resin flowability. In this regard, the above-mentioned prior art does not describe a technique for filling a fine circuit pattern (between wirings) with a molding material.

CITATION LIST

Patent Literature

Patent Literature 1: WO 2017/115813 A

SUMMARY OF INVENTION

The present invention has been made in view of such circumstances, and an object thereof is to provide a resin composition, which exhibits moldability to be applicable to a laminated wiring board and can provide a cured product which exhibits low dielectric properties and high heat resistance and is hardly affected by changes in the external environment, and the like. Another object of the present invention is to provide a prepreg, a film with resin, a metal foil with resin, a metal-clad laminate, and a wiring board which are obtained using the resin composition.

The present inventors found out that the objects are achieved by the following configuration as a result of extensive studies, and achieved the present invention by further conducting diligent studies.

In other words, the resin composition according to an aspect of the present invention contains a polymer having a structural unit represented by Formula (1) described later in the molecule and a free radical compound, and the free radical compound has at least one free radical group selected from the group consisting of structures represented by Formulas (2), (3), (4) and (5) described later in the molecule.

DESCRIPTION OF EMBODIMENTS

Figure 1:
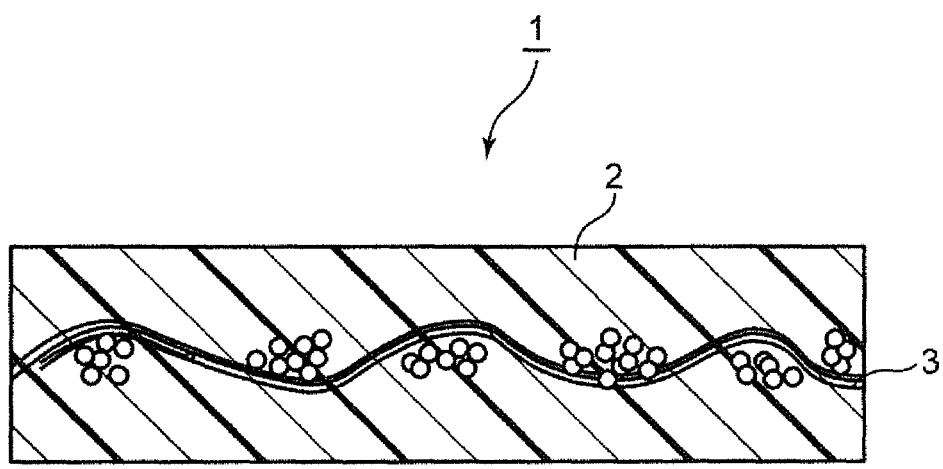
FIG. 1 is a schematic sectional view illustrating an example of a prepreg according to an embodiment of the present invention.

Hereinafter, embodiments according to the present invention will be specifically described, but the present invention is not limited thereto.

[Resin Composition]

The resin composition according to an aspect of the present invention is a resin composition, which contains a polymer having a structural unit represented by the following Formula (1) in the molecule and a free radical compound and in which the free radical compound has at least one free radical group selected from the group consisting of structures represented by the following Formulas (2), (3), (4) and (5) in the molecule.

[Chemical formula. 1]

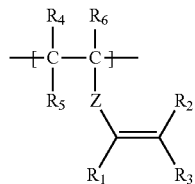
(1)

[Chemical formula. 2]

(2)

[Chemical formula. 3]

(3)

[Chemical formula. 4]

(4)

[Chemical formula. 5]

(5)

In Formula (1), Z represents an arylene group, $R_1$ to $R_3$ each independently represent a hydrogen atom or an alkyl group, and $R_4$ to $R_6$ each independently represent a hydrogen atom or an alkyl group having 1 to 6 carbon atoms.

According to such a configuration, it is possible to provide a resin composition, which exhibits excellent moldability to be fillable in a circuit pattern and can provide a cured product which exhibits low dielectric properties and high heat resistance and can suitably maintain the low dielectric properties even after a heat treatment or a water absorption treatment. According to the present invention, it is possible to provide a prepreg, a film with resin, a metal foil with resin, a metal-clad laminate, and a wiring board which exhibit excellent performance by using the resin composition.

By containing a free radical compound having a structure as described above in the resin composition containing the polymer, it is possible to obtain a resin composition which exhibits excellent moldability and provides a cured product which exhibits low dielectric properties and high heat resistance and can suitably maintain the low dielectric properties even after a heat treatment and a water absorption treatment.

It is considered that this is because the addition of free radical compound can improve the moldability while maintaining the properties of cured product such as Tg to a certain extent.

First, each component constituting the resin composition of the present embodiment will be described.

(Polymer)

The polymer is not particularly limited as long as it is a polymer having the structural unit represented by Formula (1) in the molecule. The polymer may have a structural unit other than the structural unit represented by Formula (1) as long as it is a polymer having the structural unit represented by Formula (1) in the molecule. The polymer may include a repeating unit in which the structural unit represented by Formula (1) is repeatedly bonded, or the polymer may be a polymer in which a repeating unit in which the structural unit represented by Formula (1) is repeatedly bonded and a repeating unit in which a structural unit other than the structural unit represented by Formula (1) is repeatedly bonded are randomly bonded. In other words, the polymer may be a block copolymer or a random copolymer when the polymer has a structural unit other than the structural unit represented by Formula (1).

The arylene group represented by Z in Formula (1) is not particularly limited. Examples of this arylene group include a monocyclic aromatic group such as a phenylene group, and a polycyclic aromatic group in which the aromatic is not a single ring but a polycyclic aromatic such as a naphthalene ring. This arylene group also includes a derivative in which a hydrogen atom bonded to an aromatic ring is substituted with a functional group such as an alkenyl group, an alkynyl group, a formyl group, an alkylcarbonyl group, an alkenylcarbonyl group, or an alkynylcarbonyl group.

The alkyl group represented by $R_1$ to $R_3$ in Formula (1) is not particularly limited, and for example, an alkyl group having 1 to 18 carbon atoms is preferable and an alkyl group having 1 to 10 carbon atoms is more preferable. Specific examples thereof include a methyl group, an ethyl group, a propyl group, a hexyl group, and a decyl group.

The alkyl group having 1 to 6 carbon atoms, which is represented by $R_4$ to $R_6$ in Formula (1), is not particularly limited, and specific examples thereof include a methyl group, an ethyl group, a propyl group, and a hexyl group.

It is preferable that the polymer includes an aromatic polymer having a structural unit derived from a bifunctional aromatic compound in which two carbon-carbon unsaturated double bonds are bonded to an aromatic ring as the structural unit represented by Formula (1). The structural unit derived from a bifunctional aromatic compound is a structural unit obtained by polymerizing the bifunctional aromatic compound. In the present specification, the aromatic polymer is also referred to as a divinyl aromatic polymer.

The bifunctional aromatic compound is not particularly limited as long as it is a bifunctional aromatic compound in which two carbon-carbon unsaturated double bonds are bonded to an aromatic ring. Examples of the bifunctional aromatic compound include m-divinylbenzene, p-divinylbenzene, 1,2-diisopropenylbenzene, 1,3-diisopropenylbenzene, 1,4-diisopropenylbenzene, 1,3-divinylnaphthalene, 1,8-divinylnaphthalene, 1,4-divinylnaphthalene, 1,5-divinylnaphthalene, 2,3-divinylnaphthalene, 2,7-divinylnaphthalene, 2,6-divinylnaphthalene, 4,4'-divinylbiphenyl, 4,3'-divinylbiphenyl, 4,2'-divinylbiphenyl, 3,2'-divinylbiphenyl, 3,3'-divinylbiphenyl, 2,2'-divinylbiphenyl, 2,4-divinylbiphenyl, 1,2-divinyl-3,4-dimethylbenzene, 1,3-divinyl-4,5,8-tributylnaphthalene, and 2,2'-divinyl 4-ethyl-4'-propylbiphenyl. These may be used singly or in combination of two or more kinds thereof. Among these, the bifunctional aromatic compound is preferably divinylbenzene such as m-divinylbenzene and p-divinylbenzene, more preferably p-divinylbenzene.

The aromatic polymer may have not only a structural unit derived from the bifunctional aromatic compound but also another structural unit. Examples of the other structural unit include a structural unit derived from a monofunctional aromatic compound in which one carbon-carbon unsaturated double bond is bonded to an aromatic ring, a structural unit derived from a trifunctional aromatic compound in which three carbon-carbon unsaturated double bonds are bonded to an aromatic ring, structural units derived from indenes, and structural units derived from acenaphthylenes. The structural unit derived from a monofunctional aromatic compound is a structural unit obtained by polymerizing the monofunctional aromatic compound. The structural unit derived from a trifunctional aromatic compound is a structural unit obtained by polymerizing the trifunctional aromatic compound. The structural units derived from indenes are structural units obtained by polymerizing indenes. The structural units derived from acenaphthylenes are structural units obtained by polymerizing acenaphthylenes.

In the monofunctional aromatic compound, it is only required that one carbon-carbon unsaturated double bond is bonded to an aromatic ring, and a group other than the carbon-carbon unsaturated double bond may be bonded to the aromatic ring. Examples of the monofunctional aromatic compound include a monofunctional aromatic compound in which one carbon-carbon unsaturated double bond is bonded to an aromatic ring and a group other than this carbon-carbon unsaturated double bond is not bonded the aromatic ring and a monofunctional aromatic compound in which one carbon-carbon unsaturated double bond is bonded to an aromatic ring and an alkyl group such as an ethyl group is further bonded to the aromatic ring.

Examples of the monofunctional aromatic compound in which one carbon-carbon unsaturated double bond is bonded to an aromatic ring and a group other than this carbon-carbon unsaturated double bond is not bonded the aromatic ring include styrene, 2-vinylbiphenyl, 3-vinylbiphenyl, 4-vinylbiphenyl, 1-vinylnaphthalene, 2-vinylnaphthalene, and α-alkyl-substituted styrene. Examples of the α-alkyl-substituted styrene include α-methylstyrene, α-ethylstyrene, α-propylstyrene, α-n-butylstyrene, α-isobutylstyrene, α-t-butylstyrene, α-n-pentylstyrene, α-2-methylbutylstyrene, α-3-methylbutyl-2-styrene, α-t-butylstyrene, α-t-butylstyrene, α-n-pentylstyrene, α-2-methylbutylstyrene, α-3-methylbutylstyrene, α-t-pentylstyrene, α-n-hexylstyrene, α-2-methylpentylstyrene, α-3-methylpentylstyrene, α-1-methylpentylstyrene, α-2,2-dimethylbutylstyrene, α-2,3-dimethylbutylstyrene, α-2,4-dimethylbutylstyrene, α-3,3-dimethylbutylstyrene, α-3,4-dimethylbutylstyrene, α-4,4-dimethylbutylstyrene, α-2-ethylbutylstyrene, α-1-ethylbutylstyrene, α-cyclohexylstyrene, and α-cyclohexylstyrene. These may be used singly or in combination of two or more kinds thereof.

Examples of monofunctional aromatic compounds in which one carbon-carbon unsaturated double bond is bonded to an aromatic ring and an alkyl group is further bonded to the aromatic ring include a nuclear alkyl-substituted aromatic compound and alkoxy-substituted styrene.

Examples of the nuclear alkyl-substituted aromatic compound include an ethyl vinyl aromatic compound in which an alkyl group bonded to an aromatic ring is an ethyl group, nuclear alkyl-substituted styrene in which an alkyl group is bonded to styrene as an aromatic ring, and nuclear alkyl-substituted aromatic compounds (other nuclear alkyl-substituted aromatic compounds) other than the ethyl vinyl aromatic compound and the nuclear alkyl-substituted styrene.

Examples of the ethyl vinyl aromatic compound include o-ethyl vinyl benzene, m-ethylvinylbenzene, p-ethylvinylbenzene, 2-vinyl-2'-ethylbiphenyl, 2-vinyl-3'-ethylbiphenyl, 2-vinyl-4'-ethylbiphenyl, 3-vinyl-2'-ethylbiphenyl, 3-vinyl-3'-ethylbiphenyl, 3-vinyl-4'-ethylbiphenyl, 4-vinyl-2'-ethylbiphenyl, 4-vinyl-3'-ethylbiphenyl, 4-vinyl-4'-ethylbiphenyl, 1-vinyl-2-ethylnaphthalene, 1-vinyl-3-ethylnaphthalene, 1-vinyl-4-ethylnaphthalene, 1-vinyl-5-ethylnaphthalene, 1-vinyl-6-ethylnaphthalene, 1-vinyl-7-ethylnaphthalene, 1-vinyl-8-ethylnaphthalene, 2-vinyl-1-ethylnaphthalene, 2-vinyl-3-ethylnaphthalene, 2-vinyl-4-ethylnaphthalene, 2-vinyl-5-ethylnaphthalene, 2-vinyl-6-ethylnaphthalene, 2-vinyl-7-ethylnaphthalene, and 2-vinyl-8-ethylnaphthalene.

Examples of the nuclear alkyl-substituted styrene include m-methylstyrene, p-methylstyrene, m-propylstyrene, p-propylstyrene, m-n-butylstyrene, p-n-butylstyrene, m-t-butylstyrene, p-t-butylstyrene, m-n-hexylstyrene, p-n-hexylstyrene, m-cyclohexylstyrene, and p-cyclohexylstyrene.

Examples of the other nuclear alkyl-substituted aromatic compounds include 2-vinyl-2'-propylbiphenyl, 2-vinyl-3'-propylbiphenyl, 2-vinyl-4'-propylbiphenyl, 3-vinyl-2'-propylbiphenyl, 3-vinyl-3'-propylbiphenyl, 3-vinyl-4'-propylbiphenyl, 4-vinyl-2'-propylbiphenyl, 4-vinyl-3'-propylbiphenyl, 4-vinyl-4'-propylbiphenyl, 1-vinyl-2-propylnaphthalene, 1-vinyl-3-propylnaphthalene, 1-vinyl-4-propylnaphthalene, 1-vinyl-5-propylnaphthalene, 1-vinyl-6-propylnaphthalene, 1-vinyl-7-propylnaphthalene, 1-vinyl-8-propylnaphthalene, 2-vinyl-1-propylnaphthalene, 2-vinyl-3-propylnaphthalene, 2-vinyl-4-propylnaphthalene, 2-vinyl-5-propylnaphthalene, 2-vinyl-6-propylnaphthalene, 2-vinyl-7-propylnaphthalene, and 2-vinyl-8-propylnaphthalene.

Examples of the alkoxy-substituted styrene include o-ethoxystyrene, m-ethoxystyrene, p-ethoxystyrene, o-propoxystyrene, m-propoxystyrene, p-propoxystyrene, o-n-butoxystyrene, m-n-butoxystyrene, p-n-butoxystyrene, o-isobutoxystyrene, m-isobutoxystyrene, p-isobutoxystyrene, o-t-butoxystyrene, m-t-butoxystyrene, p-t-butoxystyrene, o-n-pentoxystyrene, m-n-pentoxystyrene, p-n-pentoxystyrene, α-methyl-o-butoxystyrene, α-methyl-m-butoxystyrene, α-methyl-p-butoxystyrene, o-t-pentoxystyrene, m-t-pentoxystyrene, p-t-pentoxystyrene, o-n-hexoxystyrene, m-n-hexoxystyrene, p-n-hexoxystyrene, α-methyl-o-pentoxystyrene, α-methyl-m-pentoxystyrene, α-methyl-p-pentoxystyrene, o-cyclohexoxystyrene, m-cyclohexoxystyrene, p-cyclohexoxystyrene, o-phenoxystyrene, m-phenoxystyrene, and p-phenoxystyrene.

As the monofunctional aromatic compound, the compounds exemplified above may be used singly or in combination of two or more thereof. Among the compounds exemplified above, styrene and p-ethylvinylbenzene are preferable as the monofunctional aromatic compound.

Examples of the trifunctional aromatic compound in which three carbon-carbon unsaturated double bonds are bonded to an aromatic ring include 1,2,4-trivinylbenzene, 1,3,5-trivinylbenzene, 1,2,4-triisopropenylbenzene, 1,3,5-triisopropenylbenzene, 1,3,5-trivinylnaphthalene, and 3,5,4'-trivinylbiphenyl. As the trifunctional aromatic compound, the compounds exemplified above may be used singly or in combination of two or more thereof.

Examples of the indenes include indene, alkyl-substituted indene, and alkoxyindene. Examples of the alkyl-substituted indene include methylindene, ethylindene, propylindene, butylindene, t-butylindene, sec-butylindene, n-pentylindene, 2-methyl-butylindene, 3-methyl-butylindene, n-hexylindene, 2-methyl-pentylindene, 3-methyl-pentylindene, and 4-methyl-pentylindene. Examples of the alkyloxyindene include alkyloxyindenes such as methoxyindene, ethoxyindene, putoxyindene, butoxyindene, t-butoxyindene, sec-butoxyindene, n-pentoxyindene, 2-methyl-butoxyindene, 3-methyl-butoxyindene, n-hexitosiindene, 2-methyl-pentoxyindene, 3-methyl-pentoxyindene, and 4-methyl-pentoxyindene. As the indenes, the compounds exemplified above may be used singly or in combination of two or more thereof.

Examples of the acenaphthylenes include acenaphthylene, alkylacenaphthylenes, halogenated acenaphthylenes, and phenylacenaphthylenes. Examples of the alkyl acenaphthylenes include 1-methyl acenaphthylene, 3-methyl acenaphthylene, 4-methyl acenaphthylene, 5-methyl acenaphthylene, 1-ethyl acenaphthylene, 3-ethyl acenaphthylene, 4-ethyl acenaphthylene, and 5-ethyl acenaphthylene. Examples of the halogenated acenaphthylenes include 1-chloroacenaphthylene, 3-chloroacenaphthylene, 4-chloroacenaphthylene, 5-chloroacenaphthylene, 1-bromoacenaphthylene, 3-bromoacenaphthylene, 4-bromoacenaphthylene, and 5-bromoacenaphthylene. Examples of the phenylacenaphthylenes include 1-phenylacenaphthylene, 3-phenylacenaphthylene, 4-phenylacenaphthylene, and 5-phenylacenaphthylene. As the acenaphthylenes, the compounds exemplified above may be used singly or in combination of two or more thereof.

When the aromatic polymer has not only a structural unit derived from the bifunctional aromatic compound but also another structural unit, the aromatic polymer is a copolymer of a structural unit derived from the bifunctional aromatic compound and another structural unit such as a structural unit derived from the monofunctional aromatic compound. This copolymer may be a block copolymer or a random copolymer.

The polymer is not particularly limited as long as it is a polymer having the structural unit represented by Formula (1) in the molecule as described above. It is preferable that the structural unit represented by Formula (1) includes a structural unit represented by the following Formula (9). In other words, the polymer is preferably a polymer having a structural unit represented by the following Formula (2) in the molecule.

[Chemical formula. 6]

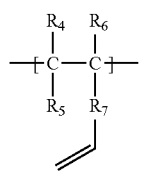

(9)

$R_4$ to $R_6$ in Formula (9) are the same as $R_4$ to $R_6$ in Formula (1), Specifically, $R_4$ to $R_6$ each independently represent a hydrogen atom or an alkyl group having 1 to 6 carbon atoms. $R_7$ represents an arylene group having 6 to 12 carbon atoms.

The arylene group having 6 to 12 carbon atoms in Formula (9) is not particularly limited. Examples of this arylene group include a monocyclic aromatic group such as a phenylene group and a bicyclic aromatic group in which the aromatic is not a monocyclic ring but a bicyclic aromatic such as a naphthalene ring. This arylene group also includes a derivative in which a hydrogen atom bonded to an aromatic ring is substituted with a functional group such as an alkenyl group, an alkynyl group, a formyl group, an alkylcarbonyl group, an alkenylcarbonyl group, or an alkynylcarbonyl group.

It is preferable that the structural unit represented by Formula (9) includes a structural unit represented by the following Formula (10). In other words, in the structural unit represented by Formula (9), $R_7$ is preferably a phenylene group. Among the phenylene groups, a p-phenylene group is more preferable.

[Chemical formula. 7]

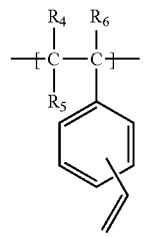

(10)

$R_4$ to $R_6$ in Formula (10) are the same as $R_4$ to $R_6$ in Formula (1). Specifically, $R_4$ to $R_6$ each independently represent a hydrogen atom or an alkyl group having 1 to 6 carbon atoms.

The polymer preferably includes a polymer further having a structural unit represented by the following Formula (11) in the molecule. In other words, it is preferable that the polymer has a structural unit derived from a monofunctional aromatic compound in which one carbon-carbon unsaturated double bond is bonded to an aromatic ring as the structural unit represented by the following Formula (11). Hence, the polymer is preferably a polymer having a structural unit represented by Formula (1) and a structural unit represented by the following Formula (11) in the molecule. In other words, the polymer may have a structural unit other than the structural unit represented by Formula (1) and the structural unit represented by the following Formula (11) (structural unit other than (1) and (11)) as long as it is a polymer having a structural unit represented by Formula (1) and the structural unit represented by the following Formula (11) in the molecule. The polymer may have a structural unit other than (1) and (11), the polymer may be a polymer in which a repeating unit in which the structural unit represented by Formula (1) is repeatedly bonded, a repeating unit in which the structural unit represented by the following Formula (11) is repeatedly bonded, and a repeating unit in which a structural unit other than (1) and (11) is repeatedly bonded are randomly bonded, or the polymer may be a block copolymer or a random copolymer.

[Chemical formula. 8]

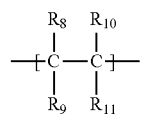

(11)

In Formula (11), $R_8$ to $R_{10}$ are independent of each other. In other words, $R_8$ to $R_{10}$ may be the same group as or different groups from each other. $R_8$ to $R_{10}$ represent a hydrogen atom or an alkyl group having 1 to 6 carbon atoms. $R_{11}$ represents an aryl group.

The alkyl group having 1 to 6 carbon atoms, which is represented by $R_8$ to $R_{10}$, in Formula (11) is not particularly limited and may be the same as the alkyl group having 1 to 6 carbon atoms, which is represented by $R_4$ to $R_6$ in Formula (1). Specific examples of the alkyl group having 1 to 6 carbon atoms, which is represented by $R_8$ to $R_{10}$, in Formula (11) include a methyl group, an ethyl group, a propyl group, and a hexyl group.

The aryl group represented by $R_{11}$ in Formula (11) is not particularly limited, and may be an unsubstituted aryl group or an aryl group in which a hydrogen atom bonded to an aromatic ring is substituted with an alkyl group or the like. The unsubstituted aryl group may be a group obtained by eliminating one hydrogen atom from an aromatic hydrocarbon having one aromatic ring or a group obtained by eliminating one hydrogen atom from an aromatic hydrocarbon having two or more independent aromatic rings (for example, biphenyl). Examples of the aryl group in Formula (11) include an unsubstituted aryl group having 6 to 12 carbon atoms and an arylene group having 6 to 18 carbon atoms in which a hydrogen atom of an aryl group having 6 to 12 carbon atoms is substituted with an alkyl group having 1 to 6 carbon atoms. Examples of the unsubstituted aryl group having 6 to 12 carbon atoms include a phenyl group, a naphthyl group, and a biphenylyl group. Specific examples of the aryl group in Formula (11), namely, $R_{11}$ include the aryl groups presented in the following Tables 1 and 2.

TABLE 1

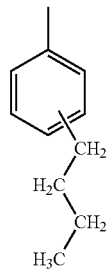

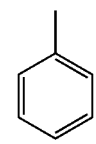

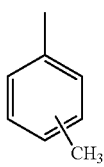

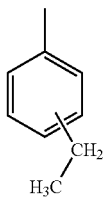

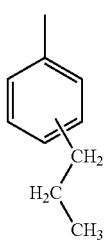

TABLE 1-continued

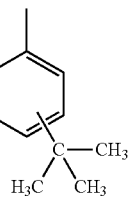

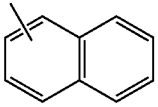

TABLE 2

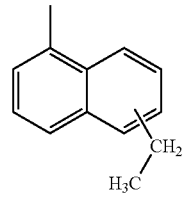

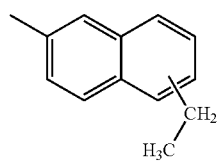

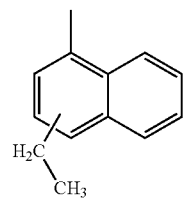

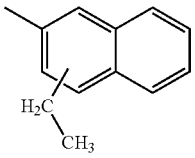

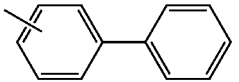

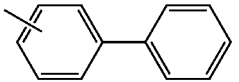

TABLE 2-continued

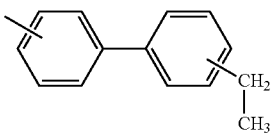

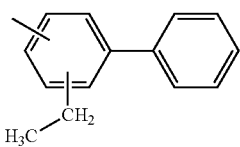

The weight average molecular weight of the polymer is preferably 1,500 to 40,000, more preferably 1,500 to 35,000. When the weight average molecular weight is too low, the heat resistance and the like tend to decrease. When the weight average molecular weight is too high, the moldability and the like tend to decrease. Hence, when the weight average molecular weight of the resin composition is within the above range, excellent heat resistance and moldability are exhibited. Here, the weight average molecular weight is only required to be one measured by general molecular weight measurement, and specific examples thereof include a value measured by gel permeation chromatography (GPC).

In the polymer, when the sum of structural units in the polymer is 100 mol %, the molar content percentage of the structural unit represented by Formula (1) is preferably a molar content within the range of the polymerization average molecular weight. Specifically, the molar content percentage is preferably 2 to 95 mol %, more preferably 8 to 81 mol %. The molar content percentage of the structural unit represented by Formula (9) and the molar content of the structural unit represented by Formula (10) are the same as the molar content percentage of the structural unit represented by Formula (1). Specifically, the molar content percentages are preferably 2 to 95 mol %, more preferably 8 to 81 mol %. When the polymer is a polymer having a structural unit represented by Formula (1) and a structural unit represented by Formula (11) in the molecule, the molar content percentage of the structural unit represented by Formula (1) is preferably 2 to 95 mol %, more preferably 8 to 81 mol % and the molar content percentage of the structural unit represented by Formula (11) is preferably 5 to 98 mol %, more preferably 19 to 92 mol %.

In the polymer, the average number of structural units represented by Formula (1) is preferably a number within the range of the polymerization average molecular weight. Specifically, the average number is preferably 1 to 160, more preferably 3 to 140. The average number of structural units represented by Formula (9) and the average number of structural units represented by Formula (10) are the same as the average number of structural units represented by Formula (1). Specifically, the average number is preferably 1 to 160, more preferably 3 to 140. When the polymer is a polymer having a structural unit represented by Formula (1) and a structural unit represented by Formula (11) in the molecule, the average number of structural units represented by Formula (1) is preferably 1 to 160, more preferably 3 to 0.140 and the average number of structural units represented by Formula (11) is preferably 2 to 350, more preferably 4 to 300.

Specific examples of the polymer include a polymer having a structural unit represented by the following Formula (12) in the molecule and further at least one of a structural unit represented by the following Formula (13) and a structural unit represented by the following Formula (14). This polymer may be a block copolymer or a random copolymer.

[Chemical formula. 9]

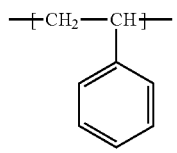

(12)

[Chemical formula. 10]

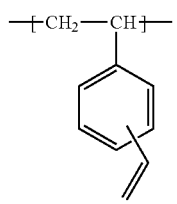

(13)

[Chemical formula. 11]

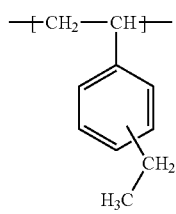

(14)

In the polymer having the structural unit represented by Formula (13) in the molecule and further at least one of the structural unit represented by Formula (12) and the structural unit represented by Formula (14), the molar content percentages of the structural unit represented by Formula (12), the structural unit represented by Formula (13), and the structural unit represented by Formula (14) are preferably 0 to 92 mol %, 8 to 54 mol %, and 0 to 89 mol %, respectively. The average number of structural units represented by Formula (12) is preferably 0 to 350, the average number of structural units represented by Formula (13) is preferably 1 to 160, and the average number of structural units represented by Formula (14) is preferably 0 to 270.

The equivalent of the vinyl group contained in the structural unit represented by Formula (1), where $R_1$ to $R_3$ are a hydrogen atom, of the polymer is preferably 250 to 1200, more preferably 300 to 1100. When the equivalent is too small, the number of the vinyl groups is too large, the reactivity is too high, and for example, troubles such as the decrease in storage stability of the resin composition or the decrease in fluidity of the resin composition may occur. When a resin composition in which the equivalent is too small is used, for example, molding defects such as generation of voids at the time of multilayer molding may occur by insufficient fluidity and the like and a problem with moldability that a highly reliable wiring board is hardly obtained may occur. When the equivalent is too large, the number of the vinyl groups is too small and the heat resistance of the cured product tends to be insufficient. Hence, when the equivalent is within the above range, excellent heat resistance and moldability are exhibited. The equivalent of the vinyl group contained in the structural unit represented by Formula (1), where $R_1$ to $R_3$ are a hydrogen atom, is a so-called vinyl equivalent.
(Free Radical Compound)

The free radical compound used in the present embodiment is not particularly limited as long as it is a free radical compound having at least one of the structures represented by Formulas (2) to (5). By containing such a free radical compound, it is considered that the resin composition of the present embodiment can exhibit excellent moldability (moldability to be finable in a circuit pattern) while exhibiting properties such as low dielectric properties and heat resistance. Further, it is considered that a cured product capable of suitably maintaining low dielectric properties even after a heat treatment or a water absorption treatment can be obtained.

Preferably, the free radical compound of the present embodiment includes at least one compound selected from the compounds represented by the following Formulas (6) to (8).

[Chemical formula. 12]

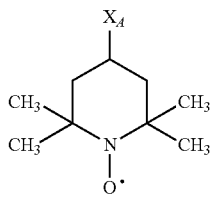

(6)

[Chemical formula. 13]

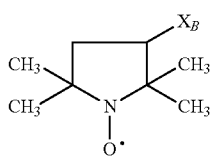

(7)

[Chemical formula. 14]

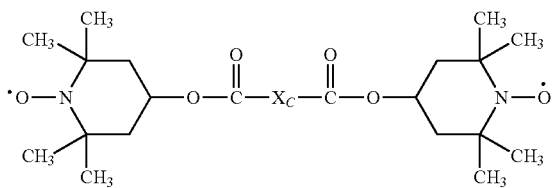

(8)

In Formulas (6) and (7), $X_A$ and $X_B$ each independently represent a hydrogen atom, an amino group, a cyano group, a hydroxy group, an isothiocyanate, a methoxy group, a carboxy group, a carbonyl group, an amide group, a benzoyloxy group, or an ether bond.

More specific examples of these include, for example, 4-acetamide, 4-glycidyloxy, 4-benzoyloxy, 4-(2-iodoacetamide), 4-[2-[2-(4-iodophenoxy)ethoxy]carbonyl]benzoyloxy, 4-methacryloyloxy, 4-oxo, and 4-propargyloxy.

In Formula (8), $X_C$ represents an alkylene group, an aromatic structure, a carbonyl group, an amide group or an ether bond.

The alkylene group may have a linear structure, a side chain structure and/or a cyclic structure, and the lengths of the linear and side chains are not particularly limited. There is a case where the solubility of the resin component in the solvent decreases when the number of carbon atoms becomes too large, and thus, for example, it is preferable that the number of carbon atoms is 16 or less and it is particularly preferable that the number of carbon atoms is about 8 or less.

When the alkylene group has a cyclic structure, examples of the cyclic structure include a seven-membered ring structure, a six-membered ring structure, and a five-membered ring structure.

Examples of the aromatic structure include a phenyl group, a pyrrole group, and a thiazole group.

More specific examples of the free radical compound that is preferably used in the present embodiment include 4-amino-2,2,6,6-tetramethylpiperidin 1-oxyl free radical, 4-acetamide-2,2,6,6-ttramethylpiperidin 1-oxyl free radical, 4-amino-2,2,6,6-tetramethylpiperidin 1-oxyl free radical, 4-carboxy-2,2,6,6-tetramethylpiperidin 1-oxyl free radical, 4-cyano-2,2,6,6-tetramethylpiperidin 1-oxyl free radical, 4-glysidyloxy-2,2,6,6-tetramethylpiperidine 1-oxyl-free radical, 4-hydroxy-2,2,6,6-tetramethylpiperidin 1-oxyl-free radical, 4-hydroxy-2,2,6,6-tetramethylpiperidin 1-oxylbenzoart free radical, 4-isothiocyanato-2,2,6,6-tetramethylpiperidin 1-oxyl free radical, 4-(2-iodoacetamide)-2,2,6,6-tetramethylpiperidin 1-oxyl free radical, 4-[2-[2-(4-iodophenoxy)ethoxy]carbonyl]benzoyloxy-2,2,6,6-tetramethylpiperidine-1-oxyl free radical, 4-methoxy-2,2,6,6-tetramethylpiperidine 1-oxyl free radical, 4-methacryloyloxy-2,2,6,6-tetramethylpiperidine 1-oxyl free radical, 4-oxo-2,2,6,6-tetramethylpiperidin 1-oxyl free radical, 4-oxo-2,2,6,6-tetramethylpiperidine 1-oxyl free radical, 2,2,6,6-tetramethylpiperidine 1-oxyl free radical, 2,2,6,6-tetramethyl-4-(2-propinyloxy)piperidine 1-oxyl free radical, 2,2,6,6-tetramethylpiperidin 1-oxyl free radical, 4,5-dihydro-4,4,5,5-tetramethyl-2-phenyl-1H-imidazole-1-yloxy-1-oxide, bis(2,2,6,6-tetramethyl-4-piperidyl-1-oxyl) sebacate, 3-carboxy-2,2,5,5-tetramethylpyrrolidine 1-oxyl free radical, 4-(2-chloroacetamide)-2,2,6,6-tetramethylpiperidin 1-oxyl free radical, 2-(4-nitrophenyl)-4,4,5,5-tetramethylimidazolin-3-oxide-i-oxyl free radical, 2-(14-carboxytetradecyl)-2-ethyl-4,4-dimethyl-3-oxazolidinyloxy free radical, and 1,1-diphenyl-2-picrylhydrazyl free radical.

Various free radical compounds are mentioned above, and these may be used singly or in combination of two or more kinds thereof.

As the free radical compounds as described above of the present embodiment, commercially available ones can also be used, and are available from, for example, Tokyo Chemical Industry Co., Ltd.
(Curing Agent)

The curing agent is not particularly limited as long as it is a curing agent capable of reacting with the polymer and curing the resin composition containing the polymer. Examples of the curing agent include a curing agent having at least one or more functional groups contributing to the reaction with the polymer in the molecule. Examples of the curing agent include styrene, styrene derivatives, a compound having an acryloyl group in the molecule, a compound having a methacryloyl group in the molecule, a compound having a vinyl group in the molecule, a compound having an allyl group in the molecule, a compound having a maleimide group in the molecule, and a compound having an acenaphthylene structure in the molecule.

Examples of the styrene derivatives include bromostyrene and dibromostyrene.

The compound having an acryloyl group in the molecule is an acrylate compound. Examples of the acrylate compound include a monofunctional acrylate compound having one acryloyl group in the molecule and a polyfunctional acrylate compound having two or more acryloyl groups in the molecule. Examples of the monofunctional acrylate compound include methyl acrylate, ethyl acrylate, propyl acrylate, and butyl acrylate. Examples of the polyfunctional acrylate compound include tricyclodecanedimethanol diacrylate.

The compound having a methacryloyl group in the molecule is a methacrylate compound. Examples of the methacrylate compound include a monofunctional methacrylate compound having one methacryloyl group in the molecule and a polyfunctional methacrylate compound having two or more methacryloyl groups in the molecule. Examples of the monofunctional methacrylate compound include methyl methacrylate, ethyl methacrylate, propyl methacrylate, and butyl methacrylate. Examples of the polyfunctional methacrylate compound include tricyclodecanedimethanol dimethacrylate.

The compound having a vinyl group in the molecule is a vinyl compound. Examples of the vinyl compound include a monofunctional vinyl compound (monovinyl compound) having one vinyl group in the molecule and a polyfunctional vinyl compound having two or more vinyl groups in the molecule. Examples of the polyfunctional vinyl compound include divinylbenzene and polybutadiene.

The compound having an allyl group in the molecule is an allyl compound. Examples of the allyl compound include a monofunctional allyl compound having one allyl group in the molecule and a polyfunctional allyl compound having two or more allyl groups in the molecule. Examples of the polyfunctional allyl compound include diallyl phthalate (DAP).

The compound having a maleimide group in the molecule is a maleimide compound. Examples of the maleimide compound include a monofunctional maleimide compound having one maleimide group in the molecule, a polyfunctional maleimide compound having two or more maleimide groups in the molecule, and a modified maleimide compound. Examples of the modified maleimide compound include a modified maleimide compound in which a part of the molecule is modified with an amine compound, a modified maleimide compound in which a part of the molecule is modified with a silicone compound, and a modified maleimide compound in which a part of the molecule is modified with an amine compound and a silicone compound.

The compound having an acenaphthylene structure in the molecule is an acenaphthylene compound. Examples of the acenaphthylene compound include acenaphthylene, alkylacenaphthylenes, halogenated acenaphthylenes, and phenylacenaphthylenes. Examples of the alkyl acenaphthylenes include 1-methyl acenaphthylene, 3-methyl acenaphthylene, 4-methyl acenaphthylene, 5-methyl acenaphthylene, 1-ethyl acenaphthylene, 3-ethyl acenaphthylene, 4-ethyl acenaphthylene, and 5-ethyl acenaphthylene. Examples of the halogenated acenaphthylenes include 1-chloroacenaphthylene, 3-chloroacenaphthylene, 4-chloroacenaphthylene, 5-chloroacenaphthylene, 1-bromoacenaphthylene, 3-bromoacenaphthylene, 4-bromoacenaphthylene, and 5-bromoacenaphthylene. Examples of the phenylacenaphthylenes include 1-phenylacenaphthylene, 3-phenylacenaphthylene, 4-phenylacenaphthylene, and 5-phenylacenaphthylene. The acenaphthylene compound may be a monofunctional acenaphthylene compound having one acenaphthylene structure in the molecule as described above or may be a polyfunctional acenaphthylene compound having two or more acenaphthylene structures in the molecule.

Among the above, the curing agent is preferably, for example, a polyfunctional acrylate compound having two or more acryloyl groups in the molecule, a polyfunctional methacrylate compound having two or more methacryloyl groups in the molecule, a polyfunctional vinyl compound having two or more vinyl groups in the molecule, a styrene derivative, an allyl compound having an allyl group in the molecule, a maleimide compound having a maleimide group in the molecule, and an acenaphthylene compound having an acenaphthylene structure in the molecule.

As the curing agent, the above curing agents may be used singly or in combination of two or more kinds thereof.

The weight average molecular weight of the curing agent is preferably 100 to 5000, more preferably 100 to 4000, still more preferably 100 to 3000. When the weight average molecular weight of the curing agent is too low, the curing agent may easily volatilize from the compounding component system of the resin composition. When the weight average molecular weight of the curing agent is too high, the viscosity of the varnish of the resin composition and the melt viscosity at the time of heat molding may be too high. Hence, a resin composition imparting superior heat resistance to the cured product is obtained when the weight average molecular weight of the curing agent is within such a range. It is considered that this is because the resin composition containing the polymer can be suitably cured by the reaction of the curing agent with the polymer. Here, the weight average molecular weight may be measured by a general molecular weight measurement method, and specific examples thereof include a value measured by gel permeation chromatography (GPC).

The average number (number of functional groups) of the functional groups, which contribute to the reaction of the curing agent with the polymer, per one molecule of the curing agent varies depending on the weight average molecular weight of the curing agent but is, for example, preferably 1 to 20, more preferably 2 to 18. When this number of functional groups is too small, sufficient heat resistance of the cured product tends to be hardly attained. When the number of functional groups is too large, the reactivity is too high and, for example, troubles such as a decrease in the storage stability of the resin composition or a decrease in the fluidity of the resin composition may occur.

(Reaction Initiator)

The resin composition according to the present embodiment may further contain a reaction initiator (initiator). When the resin composition contains only the modified polyphenylene ether compound and the curing agent as well, the curing reaction may proceed. When the resin composition contains only the modified polyphenylene ether compound as well, the curing reaction may proceed. However, a reaction initiator may be added since there is a case where it is difficult to raise the temperature until curing proceeds depending on the process conditions.

The reaction initiator is not particularly limited as long as it can promote the curing reaction of the modified polyphenylene ether compound (and the curing agent in the case of containing the curing agent). Specific examples thereof include a metal oxide, an azo compound, and an organic peroxide.

Specific examples of the metal oxide include metal salts of carboxylic acids.

Specific examples of the organic peroxide include α,α'-di(t-butylperoxy)diisopropylbenzene, 2,5-dimethyl-2,5-di(t-butylperoxy)-3-hexyne, benzoyl peroxide, 3,3',5,5'-tetramethyl-1,4-diphenoquinone, chloranil, 2,4,6-tri-t-butylphenoxyl, t-butylperoxyisopropyl monocarbonate, and azobisisobutyronitrile.

Specific examples of the azo compound include 2,2'-azobis(2,4,4-trimethylpentane), 2,2'-azobis(N-butyl-2-methylpropionamide), and 2,2'-azobis(2-methylbutyronitrile).

Among these, preferred reaction initiators are 2,2'-azobis (2,4,4-trimethylpentane), 2,2'-azobis(N-butyl-2-methylpropionamide) and the like. These reaction initiators slightly affect the dielectric properties. These reaction initiators have a relatively high reaction initiation temperature and thus have an advantage of being able to suppress the promotion of the curing reaction at the time point at which curing is not required, for example, at the time of prepreg drying, and the decrease in storage stability of the resin composition.

The reaction initiators as described above may be used singly or in combination of two or more kinds thereof.
(Inorganic Filler)

The resin composition according to the present embodiment may further contain a filler such as an inorganic filler. Examples of the filler include those added to suppress thermal expansion and to enhance flame retardancy of the cured product of the resin composition, and the filler is not particularly limited. The heat resistance, flame retardancy and the like can be further enhanced by containing a filler. Specific examples of the filler include silica such as spherical silica, metal oxides such as alumina, titanium oxide, and mica, metal hydroxides such as aluminum hydroxide and magnesium hydroxide, talc, aluminum borate, barium sulfate, and calcium carbonate. As the filler, silica, mica, and talc are preferable and spherical silica is more preferable among these. The filler may be used singly or in combination of two or more kinds thereof. The filler may be used as it is, or a filler subjected to a surface treatment with the silane coupling agent may be used.

As the inorganic filler, it is also preferable to use silica in which the ratio of the number of Si atoms contained in the silanol group is 3% or less with respect to the total number of Si atoms. By containing silica having a small number of silanol groups as described above in the resin composition of the present embodiment as an inorganic filler, it is considered that a resin composition is obtained which provides a cured product capable of more suitably maintaining the low dielectric properties even after a heat treatment. In the silica, the ratio of the number of Si atoms contained in the silanol groups to the total number of Si atoms is 3% or less, preferably 2.5% or less, more preferably 2% or less. It is more preferable as this ratio is lower, but in reality, the limit is about 0.1%. From this fact, the ratio is preferably 0.1% to 3%.

The measurement of the ratio of the number of Si atoms contained in the silanol groups to the total number of Si atoms in silica is not particularly limited as long as the ratio of the number of Si atoms contained in the silanol groups (Si—OH) contained in silica to the total number of Si atoms contained in the silica can be measured. For example, the ratio can be measured by acquiring the silica spectrum through solid-state $^{29}$Si-NMR measurement, and the like.
(Modified Polyphenylene Ether Compound)

It is preferable that the resin composition further contains a modified polyphenylene ether compound of which the terminal is modified with a substituent having a carbon-carbon unsaturated double bond. The modified polyphenylene ether compound is not particularly limited as long as it is a modified polyphenylene ether compound of which the terminal is modified with a substituent having a carbon-carbon unsaturated double bond.

The substituent having a carbon-carbon unsaturated double bond is not particularly limited. Examples of the substituent include a substituent represented by the following Formula (15) and a substituent represented by the following Formula (16).

[Chemical formula. 15]

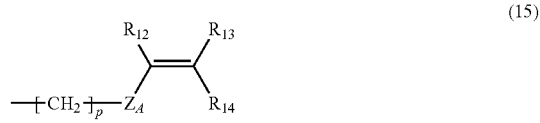

(15)

In Formula (15), p represents an integer 0 to 10. $Z_A$ represents an arylene group. $R_{12}$ to $R_{14}$ are independent of each other. In other words, $R_{12}$ to $R_{14}$ may be the same group as or different groups from each other. $R_{12}$ to $R_{14}$ represent a hydrogen atom or an alkyl group.

In a case where p in Formula (15) is 0, it indicates that $Z_A$ is directly bonded to the terminal of polyphenylene ether.

This arylene group is not particularly limited. Examples of this arylene group include a monocyclic aromatic group such as a phenylene group, and a polycyclic aromatic group in which the aromatic is not a single ring but a polycyclic aromatic such as a naphthalene ring. This arylene group also includes a derivative in which a hydrogen atom bonded to an aromatic ring is substituted with a functional group such as an alkenyl group, an alkynyl group, a formyl group, an alkylcarbonyl group, an alkenylcarbonyl group, or an alkynylcarbonyl group. In addition, the alkyl group is not particularly limited and is, for example, preferably an alkyl group having 1 to 18 carbon atoms and more preferably an alkyl group having 1 to 10 carbon atoms. Specific examples thereof include a methyl group, an ethyl group, a propyl group, a hexyl group, and a decyl group.

[Chemical formula. 16]

(16)

In Formula (16), $R_{15}$ represents a hydrogen atom or an alkyl group. The alkyl group is not particularly limited and is, for example, preferably an alkyl group having 1 to 18 carbon atoms and more preferably an alkyl group having 1 to 10 carbon atoms. Specific examples thereof include a methyl group, an ethyl group, a propyl group, a hexyl group, and a decyl group.

Preferred specific examples of the substituent represented by Formula (15) include, for example, a substituent having a vinylbenzyl group. Examples of the substituent having a vinylbenzyl group include a substituent represented by the following Formula (17). Examples of the substituent represented by Formula (16) include an acrylate group and a methacrylate group.

[Chemical formula. 17]

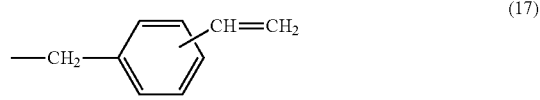

(17)

More specific examples of the substituent include vinylbenzyl groups (ethenylbenzyl groups) such as a p-ethenylbenzyl group and an m-ethenylbenzyl group, a vinylphenyl group, an acrylate group, and a methacrylate group.

It is preferable that the modified polyphenylene ether compound has a polyphenylene ether chain in the molecule and has, for example, a repeating unit represented by the following Formula (18) in the molecule.

[Chemical formula. 18]

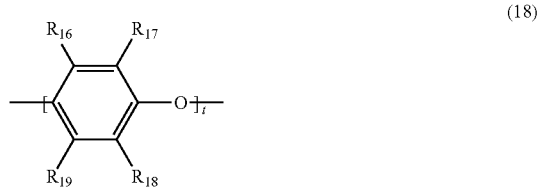

(18)

In Formula (18), t represents 1 to 50. $R_{16}$ to $R_{19}$ are independent of each other. In other words, $R_{16}$ to $R_{19}$ may be the same group as or different groups from each other. $R_{16}$ to $R_{19}$ represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferable.

Specific examples of the respective functional groups mentioned in Rib to $R_{19}$ include the following.

The alkyl group is not particularly limited and is, for example, preferably an alkyl group having 1 to 18 carbon atoms and more preferably an alkyl group having 1 to 10 carbon atoms. Specific examples thereof include a methyl group, an ethyl group, a propyl group, a hexyl group, and a decyl group.

The alkenyl group is not particularly limited and is, for example, preferably an alkenyl group having 2 to 18 carbon atoms and more preferably an alkenyl group having 2 to 10 carbon atoms. Specific examples thereof include a vinyl group, an allyl group, and a 3-butenyl group.

The alkynyl group is not particularly limited and is, for example, preferably an alkynyl group having 2 to 18 carbon atoms and more preferably an alkynyl group having 2 to 10 carbon atoms. Specific examples thereof include an ethynyl group and a prop-2-yn-1-yl group (propargyl group).

The alkylcarbonyl group is not particularly limited as long as it is a carbonyl group substituted with an alkyl group and is, for example, preferably an alkylcarbonyl group having 2 to 18 carbon atoms and more preferably an alkylcarbonyl group having 2 to 10 carbon atoms. Specific examples thereof include an acetyl group, a propionyl group, a butyryl group, an isobutyryl group, a pivaloyl group, a hexanoyl group, an octanoyl group, and a cyclohexylcarbonyl group.

The alkenylcarbonyl group is not particularly limited as long as it is a carbonyl group substituted with an alkenyl group and is, for example, preferably an alkenylcarbonyl group having 3 to 18 carbon atoms and more preferably an alkenylcarbonyl group having 3 to 10 carbon atoms. Specific examples thereof include an acryloyl group, a methacryloyl group, and a crotonoyl group.

The alkynylcarbonyl group is not particularly limited as long as it is a carbonyl group substituted with an alkynyl group and is, for example, preferably an alkynylcarbonyl group having 3 to 18 carbon atoms and more preferably an alkynylcarbonyl group having 3 to 10 carbon atoms. Specific examples thereof include a propioloyl group.

The weight average molecular weight (Mw) of the modified polyphenylene ether compound is not particularly limited. Specifically, the weight average molecular weight is preferably 500 to 5000, more preferably 800 to 4000, and still more preferably 1000 to 3000. Here, the weight average molecular weight may be measured by a general molecular weight measurement method, and specific examples thereof include a value measured by gel permeation chromatography (GPC). In a case where the modified polyphenylene ether compound has a repeating unit represented by Formula (18) in the molecule, t is preferably a numerical value so that the weight average molecular weight of the modified polyphenylene ether compound is within such a range. Specifically, t is preferably 1 to 50.

When the weight average molecular weight of the modified polyphenylene ether compound is within such a range, the modified polyphenylene ether compound exhibits the excellent low dielectric properties of polyphenylene ether and not only imparts superior heat resistance to the cured product but also exhibits excellent moldability. This is considered to be due to the following. When the weight average molecular weight of ordinary polyphenylene ether is in such a range, the heat resistance of the cured product tends to decrease since the molecular weight is relatively low. With regard to this point, since the modified polyphenylene ether compound according to the present embodiment has or more unsaturated double bonds at the terminal, it is considered that a cured product exhibiting sufficiently high heat resistance is obtained. Moreover, when the weight average molecular weight of the modified polyphenylene ether compound is in such a range, the modified polyphenylene ether compound has a relatively low molecular weight and thus is considered to exhibit excellent moldability. Hence, it is considered that such a modified polyphenylene ether compound not only imparts superior heat resistance to the cured product but also exhibits excellent moldability.

In the modified polyphenylene ether compound, the average number of the substituents (number of terminal functional groups) at the molecule terminal per one molecule of the modified polyphenylene ether compound is not particularly limited. Specifically, the average number is preferably 1 to 5, more preferably 1 to 3, and still more preferably 1.5 to 3. When the number of terminal functional groups is too small, sufficient heat resistance of the cured product tends to be hardly attained. When the number of terminal functional groups is too large, the reactivity is too high and, for example, troubles such as deterioration in the storage stability of the resin composition or deterioration in the fluidity of the resin composition may occur. In other words, when such a modified polyphenylene ether compound is used, for example, molding defects such as generation of voids at the time of multilayer molding occur because of insufficient fluidity and the like and a problem of moldability that a highly reliable printed wiring board is hardly obtained may arise.

The number of terminal functional groups in the modified polyphenylene ether compound includes a numerical value expressing the average value of the substituents per one molecule of all the modified polyphenylene ether compounds existing in 1 mole of the modified polyphenylene ether compound. This number of terminal functional groups can be determined, for example, by measuring the number of hydroxyl groups remaining in the obtained modified polyphenylene ether compound and calculating the number of hydroxyl groups decreased from the number of hydroxyl groups in the polyphenylene ether before being modified. The number of hydroxyl groups decreased from the number of hydroxyl groups in the polyphenylene ether before being modified is the number of terminal functional groups. With regard to the method for measuring the number of hydroxyl groups remaining in the modified polyphenylene ether compound, the number of hydroxyl groups can be determined by adding a quaternary ammonium salt (tetraethylammonium hydroxide) to be associated with a hydroxyl group to a solution of the modified polyphenylene ether compound and measuring the UV absorbance of the mixed solution.

The intrinsic viscosity of the modified polyphenylene ether compound is not particularly limited. Specifically, the intrinsic viscosity may be 0.03 to 0.12 dl/g, and is preferably 0.04 to 0.11 dl/g and more preferably 0.06 to 0.095 dl/g. When the intrinsic viscosity is too low, the molecular weight tends to be low and low dielectric properties such as a low dielectric constant and a low dielectric loss tangent tend to be hardly attained. When the intrinsic viscosity is too high, the viscosity is high, sufficient fluidity is not attained, and the moldability of the cured product tends to decrease. Hence, if the intrinsic viscosity of the modified polyphenylene ether compound is in the above range, excellent heat resistance and moldability of the cured product can be realized.

Note that the intrinsic viscosity here is an intrinsic viscosity measured in methylene chloride at 25° C. and more specifically is, for example, a value attained by measuring the intrinsic viscosity of a methylene chloride solution (liquid temperature: 25° C.) at 0.18 g/45 ml using a viscometer. Examples of the viscometer include AVS500 Visco System manufactured by SCHOTT Instruments GmbH.

Examples of the modified polyphenylene ether compound include a modified polyphenylene ether compound represented by the following Formula (19) and a modified polyphenylene ether compound represented by the following Formula (20). Moreover, as the modified polyphenylene ether compound, these modified polyphenylene ether compounds may be used singly or two kinds of these modified polyphenylene ether compounds may be used in combination.

[Chemical formula. 19]

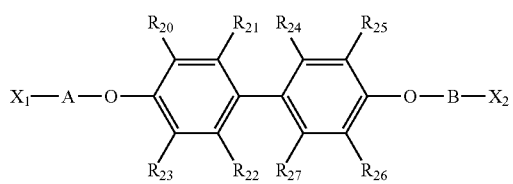

(19)

[Chemical formula. 20]

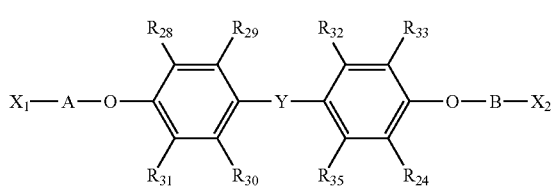

(20)

In Formulas (19) and (20), $R_{20}$ to $R_{27}$ and Res to $R_{35}$ each independently represent a hydrogen atom, an alkyl group, an alkenyl group, an alkynyl group, a formyl group, an alkyl-carbonyl group, an alkenylcarbonyl group, or an alkynylcarbonyl group. $X_1$ and $X_2$ each independently represent a substituent having a carbon-carbon unsaturated double bond. A and B represent a repeating unit represented by the following Formula (21) and a repeating unit represented by the following Formula (22), respectively. In Formula (20), Y represents a linear, branched, or cyclic hydrocarbon having 20 or less carbon atoms.

[Chemical formula. 21]

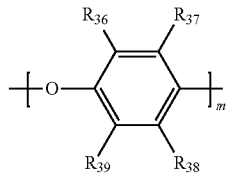

(21)

[Chemical formula. 22]

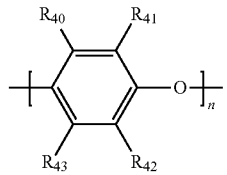

(22)

In Formulas (21) and (22), m and n each represent 0 to 20. $R_{36}$ to $R_{39}$ and $R_{40}$ to $R_{43}$ each independently represent a hydrogen atom, an alkyl group, an alkenyl group, an alkynyl group, a formyl group, an alkylcarbonyl group, an alkenylcarbonyl group, or an alkynylcarbonyl group.

The modified polyphenylene ether compound represented by Formula (19) and the modified polyphenylene ether compound represented by Formula (20) are not particularly limited as long as they are compounds satisfying the above configuration. Specifically, in Formulas (19) and (20), $R_{20}$ to $R_{27}$ and $R_{28}$ to $R_{35}$ are independent of each other as described above. In other words, $R_{20}$ to $R_{27}$ and $R_{28}$ to $R_{35}$ may be the same group as or different groups from each other. $R_{20}$ to $R_{27}$ and $R_{28}$ to $R_{35}$ represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferable.

In Formulas (21) and (22), m and n each preferably represent 0 to 20 as described above. In addition, it is preferable that m and n represent numerical values so that the sum of m and n is 1 to 30. Hence, it is more preferable that m represents 0 to 20, n represents 0 to 20, and the sum of m and n represents 1 to 30. $R_{36}$ to $R_{39}$ and $R_{40}$ to $R_{43}$ are independent of each other. In other words, $R_{36}$ to $R_{39}$ and $R_{40}$ to $R_{43}$ may be the same group as or different groups from each other. $R_{36}$ to $R_{39}$ and $R_{40}$ to $R_{43}$ represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferable.

$R_{20}$ to $R_{43}$ are the same as $R_{16}$ to $R_{19}$ in Formula (18).

In Formula (20), Y represents a linear, branched, or cyclic hydrocarbon having 20 or less carbon atoms as described above. Examples of Y include a group represented by the following Formula (23).

[Chemical formula. 23]

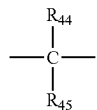
(23)

In Formula (23), $R_{44}$ and $R_{45}$ each independently represent a hydrogen atom or an alkyl group. Examples of the alkyl group include a methyl group. Examples of the group represented by Formula (23) include a methylene group, a methylmethylene group, and a dimethylmethylene group. Among these, a dimethylmethylene group is preferable.

In Formulas (19) and (20), $X_1$ and $X_2$ each independently represent a substituent having a carbon-carbon unsaturated double bond. The substituents $X_1$ and $X_2$ are not particularly limited as long as they are substituents having a carbon-carbon unsaturated double bond. Examples of the substituents $X_1$ and $X_2$ include a substituent represented by Formula (16) and a substituent represented by Formula (17). In the modified polyphenylene ether compound represented by Formula (19) and the modified polyphenylene ether compound represented by Formula (20), $X_1$ and $X_2$ may be the same substituent as or different substituents from each other.

More specific examples of the modified polyphenylene ether compound represented by Formula (19) include a modified polyphenylene ether compound represented by the following Formula (24).

[Chemical formula. 24]

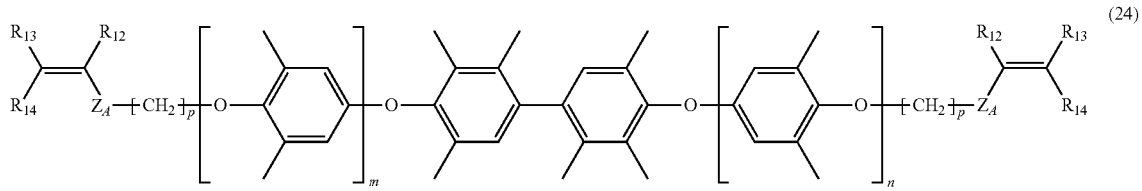
(24)

More specific examples of the modified polyphenylene ether compound represented by Formula (20) include a modified polyphenylene ether compound represented by the following Formula (25) and a modified polyphenylene ether compound represented by the following Formula (26).

[Chemical formula. 25]

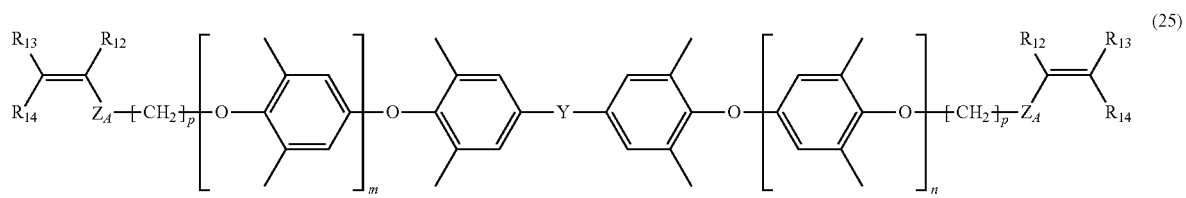
(25)

[Chemical formula. 26]

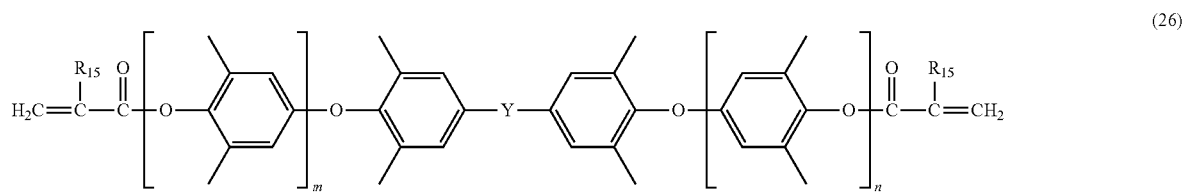
(26)

In Formulas (24) to (26), m and n are the same as m and n in Formulas (21) and (22), and are independently 0 to 20. In Formulas (24) and (25), R12 to R14, p, and ZA are the same as R12 to R14, p, and ZA in Formula (15). In Formulas (25) and (26), Y is the same as Y in the Formula (20). In Formula (26), R15 is the same as R15 in Formula (16).

The method for synthesizing the modified polyphenylene ether compound used in the present embodiment is not particularly limited as long as a modified polyphenylene ether compound of which the terminal is modified with a substituent having a carbon-carbon unsaturated double bond can be synthesized. Specific examples thereof include a method in which polyphenylene ether is reacted with a compound in which a substituent having a carbon-carbon unsaturated double bond is bonded to a halogen atom.

Examples of the compound in which a substituent having a carbon-carbon unsaturated double bond is bonded to a halogen atom include compounds in which substituents represented by Formulas (15) to (17) are bonded to a halogen atom. Specific examples of the halogen atom include a chlorine atom, a bromine atom, an iodine atom, and a fluorine atom. Among these, a chlorine atom is preferable. More specific examples of the compound in which a substituent having a carbon-carbon unsaturated double bond is bonded to a halogen atom include p-chloromethylstyrene and m-chloromethylstyrene.

Polyphenylene ether which is a raw material is not particularly limited as long as a predetermined modified polyphenylene ether compound can be finally synthesized. Specific examples thereof include those containing polyphenylene ether containing 2,6-dimethylphenol and at least one of a bifunctional phenol and a trifunctional phenol and polyphenylene ether such as poly(2,6-dimethyl-1,4-phenylene oxide) as a main component. The bifunctional phenol is a phenol compound having two phenolic hydroxyl groups in the molecule, and examples thereof include tetramethyl bisphenol A. The trifunctional phenol is a phenol compound having three phenolic hydroxyl groups in the molecule.

Examples of the method for synthesizing the modified polyphenylene ether compound include the methods described above. Specifically, polyphenylene ether as described above and a compound in which a substituent having a carbon-carbon unsaturated double bond is bonded to a halogen atom are dissolved in a solvent and stirred. By doing so, polyphenylene ether reacts with the compound in which a substituent having a carbon-carbon unsaturated double bond is bonded to a halogen atom, and the modified polyphenylene ether compound to be used in the present embodiment is obtained.

The reaction is preferably conducted in the presence of an alkali metal hydroxide. By doing so, it is considered that this reaction suitably proceeds. This is considered to be because the alkali metal hydroxide functions as a dehydrohalogenating agent, specifically, a dehydrochlorinating agent. In other words, it is considered that the alkali metal hydroxide eliminates the hydrogen halide from the phenol group in polyphenylene ether and the compound in which a substituent having a carbon-carbon unsaturated double bond is bonded to a halogen atom, and by doing so, the substituent having a carbon-carbon unsaturated double bond is bonded to the oxygen atom of the phenol group instead of the hydrogen atom of the phenol group in the polyphenylene ether.

The alkali metal hydroxide is not particularly limited as long as it can act as a dehalogenating agent, and examples thereof include sodium hydroxide. In addition, the alkali metal hydroxide is usually used in the form of an aqueous solution and is specifically used as an aqueous sodium hydroxide solution.

The reaction conditions such as reaction time and reaction temperature also vary depending on the compound in which a substituent having a carbon-carbon unsaturated double bond is bonded to a halogen atom and the like, and are not particularly limited as long as they are conditions under which the reaction as described above suitably proceeds. Specifically, the reaction temperature is preferably room temperature to 100° C. and more preferably 30° C. to 100° C. In addition, the reaction time is preferably 0.5 to 20 hours and more preferably 0.5 to 10 hours.

The solvent to be used at the time of the reaction is not particularly limited as long as it can dissolve polyphenylene ether and the compound in which a substituent having a carbon-carbon unsaturated double bond is bonded to a halogen atom, and does not inhibit the reaction of polyphenylene ether with the compound in which a substituent having a carbon-carbon unsaturated double bond is bonded to a halogen atom. Specific examples thereof include toluene.

The above reaction is preferably conducted in the presence of not only an alkali metal hydroxide but also a phase transfer catalyst. In other words, the above reaction is preferably conducted in the presence of an alkali metal hydroxide and a phase transfer catalyst. By doing so, it is considered that the above reaction more suitably proceeds. This is considered to be due to the following. This is considered to be because the phase transfer catalyst is a catalyst which has a function of taking in the alkali metal hydroxide, is soluble in both phases of a phase of a polar solvent such as water and a phase of a non-polar solvent such as an organic solvent, and can transfer between these phases. Specifically, in a case where an aqueous sodium hydroxide solution is used as an alkali metal hydroxide and an organic solvent, such as toluene, which is incompatible with water is used as a solvent, it is considered that when the aqueous sodium hydroxide solution is dropped into the solvent subjected to the reaction as well, the solvent and the aqueous sodium hydroxide solution are separated from each other and the sodium hydroxide is hardly transferred to the solvent. In that case, it is considered that the aqueous sodium hydroxide solution added as an alkali metal hydroxide hardly contributes to the promotion of the reaction. In contrast, when the reaction is conducted in the presence of an alkali metal hydroxide and a phase transfer catalyst, it is considered that the alkali metal hydroxide is transferred to the solvent in the state of being taken in the phase transfer catalyst and the aqueous sodium hydroxide solution is likely to contribute to the promotion of the reaction. For this reason, when the reaction is conducted in the presence of an alkali metal hydroxide and a phase transfer catalyst, it is considered that the above reaction more suitably proceeds.

The phase transfer catalyst is not particularly limited, and examples thereof include quaternary ammonium salts such as tetra-n-butylammonium bromide.

When the resin composition to be used in the present embodiment contains the modified polyphenylene ether compound, it is preferable to contain a modified polyphenylene ether compound obtained as described above.

(Content of Each Component)

The content of the free radical compound is preferably 0.01 to 0.4 parts by mass, more preferably 0.05 to 0.3 parts by mass, still more preferably 0.1 to 0.2 parts by mass with respect to 100 parts by mass of the sum of the polymer and the curing agent in the resin composition. When the content of the free radical compound is within the above range, it is considered that a resin composition is more reliably obtained which exhibits excellent moldability and provides a cured product which exhibits low dielectric properties and high heat resistance and can more suitably maintain the low dielectric properties even after a heat treatment and/or a water absorption treatment.

The content of the polymer is preferably 10 to 95 parts by mass, more preferably 15 to 90 parts by mass, still more preferably 20 to 90 parts by mass with respect to 100 parts by mass of the resin components (organic components) in the resin composition. In other words, the content percentage of the modified polyphenylene ether compound is preferably 10% to 95% by mass with respect to the components other than the inorganic filler in the resin composition.

The resin composition may contain the curing agent as described above, and when the resin composition contains the curing agent, for example, the content of the curing agent is preferably 5 to 50 parts by mass, more preferably 10 to 50 parts by mass with respect to 100 parts by mass of the resin components (organic components) in the resin composition. The content of the curing agent is preferably 5 to 50 parts by mass, more preferably 10 to 50 parts by mass with respect to 100 parts by mass of the sum of the polymer and the curing agent.

When the contents of the polymer and the curing agent are each within the above ranges, a resin composition imparting superior heat resistance to the cured product is obtained. It is considered that this is because the curing reaction between the polymer and the curing agent suitably proceeds.

When the modified polyphenylene ether compound is further contained in the resin composition, it is preferable that the contents of the polymer, the modified polyphenylene ether compound, and the curing agent are as follows.

The total content of the polymer and the modified polyphenylene ether compound is preferably 10 to 95 parts by mass, more preferably 15 to 90 parts by mass, still more preferably 20 to 90 parts by mass with respect to 100 parts by mass of the resin components (organic components) in the resin composition. In other words, the total content percentage of the polymer and the modified polyphenylene ether compound is preferably 10% to 95% by mass with respect to the resin components (organic components) in the resin composition.

When the contents of the polymer and the modified polyphenylene ether compound are within the above ranges, a resin composition exhibiting excellent dielectric properties and excellent moldability is obtained.

When the resin composition of the present embodiment contains the reaction initiator, the content of the reaction initiator is not particularly limited, but is, for example, preferably 0.5 to 8.0 parts by mass, more preferably 0.5 to 5.0 parts by mass, still more preferably 0.5 to 2.0 parts by mass with respect to 100 parts by mass of the total mass of the polymer and the curing agent (and the modified polyphenylene ether compound). When the content of the reaction initiator is too low, the curing reaction between the polymer and the curing agent tends not to start suitably. When the content of the initiator is too high, the dielectric loss tangent of the cured product of the obtained prepreg becomes large and excellent low dielectric properties tend to be hardly exhibited. Hence, when the content of the reaction initiator is within the above range, a cured product of a prepreg exhibiting excellent low dielectric properties is obtained.

When the resin composition of the present embodiment contains the reaction initiator, the proportion (mass ratio) of the free radical compound to the reaction initiator in the resin composition is preferably free radical compound: reaction initiator=about 0.005:1 to 0.2:1.0, more preferably about 0.01:1.0 to 0.2:1.0, still more preferably about 0.1:1.0 to 0.2:1.0. It is considered that the effects of the present invention can be thus more reliably obtained.

When the resin composition of the present embodiment contains an inorganic filler, the content percentage of the inorganic filler (filler content) is preferably 30% to 270% by mass, more preferably 50% to 250% by mass with respect to the resin composition.

(Other Components)

The resin composition according to the present embodiment may contain components (other components) in addition to the components described above if necessary as long as the effects of the present invention are not impaired. As the other components contained in the resin composition according to the present embodiment, for example, additives such as a reaction accelerator, a catalyst, a dispersant, a leveling agent, a silane coupling agent, a flame retardant, an antifoaming agent, an antioxidant, a heat stabilizer, an antistatic agent, an ultraviolet absorber, a dye or pigment, and a lubricant may be further contained. In addition to the modified polyphenylene ether compound, the curing agent, and the polymer, the resin composition may contain a thermosetting resin such as polyphenylene ether or an epoxy resin.

As described above, the resin composition according to the present embodiment may contain a flame retardant. The flame retardancy of a cured product of the resin composition can be enhanced by containing a flame retardant. The flame retardant is not particularly limited. Specifically, in the field in which halogen-based flame retardants such as bromine-based flame retardants are used, for example, ethylenedipentabromobenzene, ethylenebistetrabromoimide, deeabromodiphenyloxide, and tetradecabromodiphenoxybenzene which have a melting point of 300° C. or more are preferable. It is considered that the elimination of halogen at a high temperature and the decrease in heat resistance can be suppressed by the use of a halogen-based flame retardant. In the field of being required to be free of halogen, a phosphorus-containing flame retardant and the like are exemplified. Specific examples thereof include a phosphoric ester-based flame retardant, a phosphazene-based flame retardant, a bis(diphenylphosphine oxide)-based flame retardant, and a phosphinate-based flame retardant. Specific examples of the phosphoric ester-based flame retardant include a condensed phosphoric ester such as dixylenyl phosphate. Specific examples of the phosphazene-based flame retardant include phenoxyphosphazene. Specific examples of the bis(diphenylphosphine oxide)-based flame retardant include xylylenebis(diphenylphosphine oxide). Specific examples of the phosphinate-based flame retardant include metal phosphinates such as aluminum dialkyl phosphinate. As the flame retardant, the respective flame retardants exemplified may be used singly or in combination of two or more thereof.

(Production Method)

The method for producing the resin composition is not particularly limited, and examples thereof include a method in which the polymer and the free radical compound are mixed with other components if necessary. Specific examples thereof include the method to be described in the description of prepreg later in the case of obtaining a varnish-like composition containing an organic solvent.

In the resin composition of the present embodiment, it is preferable that T1/T2 is 5.0 or less, where T2 denotes the lowest melt viscosity and T1 denotes the melt viscosity at the temperature higher than the temperature having the lowest melt viscosity by 10° C. In this case, it is considered that there is an advantage of further improvement in moldability. More preferably, T1/T2 is more than 1.0 and 2.0 or less.

Furthermore, it is preferable that T2 is 14000 (poise) or less and T1 is 15000 (poise) or less. This is because it is considered that the resin composition is easily filled in the pattern and the moldability is improved in this case. Furthermore, it is particularly preferable that T2 is 8000 (poise) or less and T1 is 10000 (poise) or less.

In the cured product of the resin composition of the present embodiment, the dielectric loss tangent (10 GHz) is preferably 0.0024 or less, still more preferably 0.0020 or less.

When the cured product of the resin composition of the present embodiment is subjected to a moisture absorption treatment (treatment in an environment with a temperature of 85° C. and a humidity of 85% for 120 hours) with reference to JIS C 6481 (1996) and the difference between the dielectric loss tangent in the cured product subjected to this moisture absorption treatment and the dielectric loss tangent in the cured product before the moisture absorption treatment is measured, it is preferable that (dielectric loss tangent after moisture absorption treatment)−(dielectric loss tangent before moisture absorption treatment) is 0.0010 or less. The (dielectric loss tangent after moisture absorption treatment)−(dielectric loss tangent before moisture absorption treatment) is more preferably 0.0009 or less, still more preferably 0.0006 or less.

When the cured product of the resin composition of the present embodiment is held (heat-treated) for 120 hours under a condition of 130° C. and the difference between the dielectric loss tangent of the cured product subjected to this heat treatment (dielectric loss tangent after the heat treatment) and the dielectric loss tangent of the cured product before the heat treatment is measured, (dielectric loss tangent after heat treatment)−(dielectric loss tangent before heat treatment) is preferably 0.0012 or less. The (dielectric loss tangent after heat treatment)−(dielectric loss tangent before heat treatment) is more preferably 0.0010 or less.

Moreover, by using the resin composition according to the present embodiment, a prepreg, a metal-clad laminate, a wiring board, a metal foil with resin, and a film with resin can be obtained as described below. In the following description, the reference numerals indicate: 1 prepreg, 2 resin composition or semi-cured product of resin composition, 3 fibrous base material, 11 metal-clad laminate, 12 insulating layer, 13 metal foil, 14 wiring, 21 wiring board, 31 metal foil with resin, 32 and 42 resin layer, 41 film with resin, and 43 support film, respectively.

[Prepreg]

FIG. 1 is a schematic sectional view illustrating an example of a prepreg 1 according to an embodiment of the present invention.

As illustrated in FIG. 1, the prepreg 1 according to the present embodiment includes the resin composition or a semi-cured product 2 of the resin composition and a fibrous base material 3. This prepreg 1 includes the resin composition or the semi-cured product 2 of the resin composition and the fibrous base material 3 present in the resin composition or the semi-cured product 2 of the resin composition.

In the present embodiment, the semi-cured product is in a state in which the resin composition is cured to an extent that the resin composition can be further cured. In other words, the semi-cured product is in a state in which the resin composition is semi-cured (B-staged). For example, when the resin composition is heated, the viscosity gradually decreases at first, and then curing starts, and then curing starts, and the viscosity gradually increases. In such a case, the semi-cured state includes a state in which the viscosity has started to increase but curing is not completed, and the like.

The prepreg to be obtained using the resin composition according to the present embodiment may include a semi-cured product of the resin composition as described above or include the uncured resin composition itself. In other words, the prepreg may be a prepreg including a semi-cured product of the resin composition (the B-stage resin composition) and a fibrous base material or a prepreg including the resin composition before being cured (the A-stage resin composition) and a fibrous base material. The resin composition or a semi-cured product of the resin composition may be one obtained by drying or heating and drying the resin composition.

When a prepreg is manufactured, the resin composition 2 is often prepared in a varnish form and used in order to be impregnated into the fibrous base material 3 which is a base material for forming the prepreg. In other words, the resin composition 2 is usually a resin varnish prepared in a varnish form in many cases. Such a varnish-like resin composition (resin varnish) is prepared, for example, as follows.

First, the respective components, which can be dissolved in an organic solvent, in the composition of the resin composition are introduced into and dissolved in an organic solvent. At this time, heating may be performed if necessary. Thereafter, components (for example, inorganic filler), which are used if necessary but are not dissolved in the organic solvent, are added to and dispersed in the solution until a predetermined dispersion state is achieved using a ball mill, a bead mill, a planetary mixer, a roll mill or the like, whereby a varnish-like resin composition is prepared. The organic solvent used here is not particularly limited as long as it dissolves the modified polyphenylene ether compound, the curing agent and the like, and does not inhibit the curing reaction. Specific examples thereof include toluene and methyl ethyl ketone (MEK).

The method for manufacturing the prepreg is not particularly limited as long as the prepreg can be manufactured. Specifically, when manufacturing a prepreg, the resin composition which is described above and is used in the present embodiment is often prepared in a varnish form and used as a resin varnish as described above.

Specific examples of the fibrous base material include glass cloth, aramid cloth, polyester cloth, a glass nonwoven fabric, an aramid nonwoven fabric, a polyester nonwoven fabric, pulp paper, and linter paper. When glass cloth is used, a laminate exhibiting excellent mechanical strength is obtained, and glass cloth subjected to flattening is particularly preferable. Specific examples of the flattening include a method in which glass cloth is continuously pressed at an appropriate pressure using a press roll to flatly compress the yarn. The thickness of the generally used fibrous base material is, for example, 0.01 mm or more and 0.3 mm or less.

The method for manufacturing the prepreg is not particularly limited as long as the prepreg can be manufactured. Specifically, when manufacturing a prepreg, the resin composition according to the present embodiment described above is often prepared in a varnish form and used as a resin varnish as described above.

Examples of the method for manufacturing the prepreg 1 include a method in which the fibrous base material 3 is impregnated with the resin composition 2, for example, the resin composition 2 prepared in a varnish form, and then dried. The fibrous base material 3 is impregnated with the resin composition 2 by dipping, coating, and the like. If necessary, the impregnation can be repeated a plurality of times. Moreover, at this time, it is also possible to finally adjust the composition and impregnated amount to the desired composition and impregnated amount by repeating impregnation using a plurality of resin compositions having different compositions and concentrations.

The fibrous base material 3 impregnated with the resin composition (resin varnish) 2 is heated under desired heating conditions, for example, at 80° C. or more and 180° C. or less for 1 minute or more and 10 minutes or less. By heating, the prepreg 1 before being cured (A-stage) or in a semi-cured state (B-stage) is obtained. By the heating, the organic solvent can be decreased or removed by being volatilized from the resin varnish.

The prepreg including the resin composition according to the present embodiment or the semi-cured product of this resin composition is a prepreg suitably providing a cured product which exhibits low dielectric properties and high heat resistance and can suitably maintain the low dielectric properties even after a heat treatment and a water absorption treatment. Furthermore, the prepreg exhibits favorable moldability and also exhibits an excellent filling property into a circuit pattern when used in a wiring board and the like.

[Metal-Clad Laminate]

Figure 2:
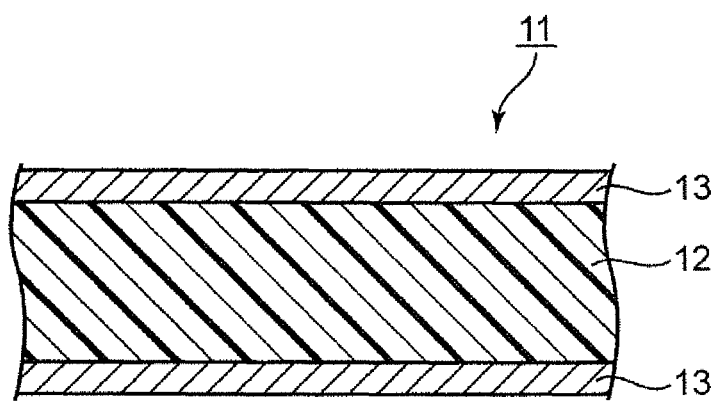
FIG. 2 is a schematic sectional view illustrating an example of a metal-clad laminate according to an embodiment of the present invention.

FIG. 2 is a schematic sectional view illustrating an example of a metal-clad laminate 11 according to an embodiment of the present invention.

As illustrated in FIG. 2, the metal-clad laminate 11 includes an insulating layer 12 containing a cured product of the prepreg 1 illustrated in FIG. 1 and a metal foil 13 to be laminated together with the insulating layer 12. In other words, the metal-clad laminate 11 includes the insulating layer 12 containing a cured product of a resin composition and the metal foil 13 provided on the insulating layer 12. The insulating layer 12 may be formed of a cured product of the resin composition or a cured product of the prepreg. In addition, the thickness of the metal foil 13 varies depending on the performance and the like to be required for the finally obtained wiring board and is not particularly limited. The thickness of the metal foil 13 can be appropriately set depending on the desired purpose and is preferably, for example, 0.2 to 70 µm. Examples of the metal foil 13 include a copper foil and an aluminum foil, and the metal foil 13 may be a copper foil with carrier which includes a release layer and a carrier for the improvement in handleability in a case where the metal foil is thin.

The method for manufacturing the metal-clad laminate 11 is not particularly limited as long as the metal-clad laminate 11 can be manufactured. Specific examples thereof include a method in which the metal-clad laminate 11 is fabricated using the prepreg 1. Examples of this method include a method in which the double-sided metal foil-clad or single-sided metal foil-clad laminate 11 is fabricated by stacking one sheet or a plurality of sheets of prepreg 1, further stacking the metal foil 13 such as a copper foil on both or one of upper and lower surfaces of the prepregs 1, and laminating and integrating the metal foils 13 and prepregs 1 by heating and pressing. In other words, the metal-clad laminate 11 is obtained by laminating the metal foil 13 on the prepreg 1 and then performing heating and pressing. Moreover, the heating and pressing conditions can be appropriately set depending on the thickness of the metal-clad laminate 11 to be manufactured, the kind of the composition of the prepreg 1, and the like. For example, it is possible to set the temperature to 170° C. to 210° C., the pressure to 3.5 to 4 MPa, and the time to 60 to 150 minutes. Moreover, the metal-clad laminate may be manufactured without using a prepreg. Examples thereof include a method in which a varnish-like resin composition is applied on a metal foil to form a layer containing the resin composition on the metal foil and then heating and pressing is performed.

The metal-clad laminate including an insulating layer containing the cured product of the resin composition according to the present embodiment is a metal-clad laminate including an insulating layer which exhibits low dielectric properties and high heat resistance and can suitably maintain the low dielectric properties even after a heat treatment and a water absorption treatment. Furthermore, the prepreg exhibits favorable moldability and also exhibits an excellent filling property into a circuit pattern when used in a wiring board and the like.

[Wiring Board]

Figure 3:
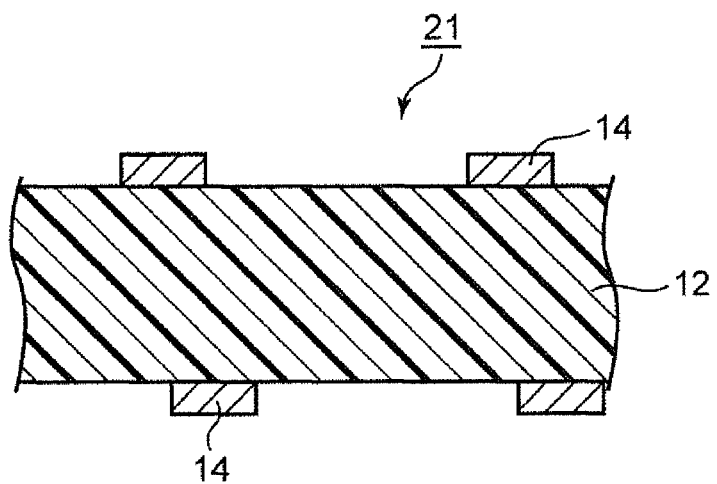
FIG. 3 is a schematic sectional view illustrating an example of a wiring board according to an embodiment of the present invention.

FIG. 3 is a schematic sectional view illustrating an example of a wiring board 21 according to an embodiment of the present invention.

The wiring board 21 according to the present embodiment is formed of an insulating layer 12 obtained by curing the prepreg 1 illustrated in FIG. 1 and wiring 14 which is laminated together with the insulating layer 12 and is formed by partially removing the metal foil 13 as illustrated in FIG. 3. In other words, the wiring board 21 includes the insulating layer 12 containing a cured product of a resin composition and the wiring 14 provided on the insulating layer 12, The insulating layer 12 may be formed of a cured product of the resin composition or a cured product of the prepreg.

The method for manufacturing the wiring board 21 is not particularly limited as long as the wiring board 21 can be manufactured. Specific examples thereof include a method in which the wiring board 21 is fabricated using the prepreg 1. Examples of this method include a method in which the wiring board 21, in which wiring is provided as a circuit on the surface of the insulating layer 12, is fabricated by forming wiring through etching and the like of the metal foil 13 on the surface of the metal-clad laminate 11 fabricated in the manner described above. In other words, the wiring board 21 is obtained by partially removing the metal foil 13 on the surface of the metal-clad laminate 11 and thus forming a circuit. Examples of the method for forming a circuit include circuit formation by a semi-additive process (SAP) or a modified semi-additive process (MSAP) in addition to the method described above. The wiring board 21 includes the insulating layer 12 which exhibits low dielectric properties and high heat resistance and can suitably maintain the low dielectric properties even after a water absorption treatment.

Such a wiring board is a wiring board including an insulating layer which exhibits low dielectric properties and high heat resistance and can suitably maintain the low dielectric properties even after a heat treatment and a water absorption treatment. Furthermore, the resin composition of the present embodiment exhibits favorable moldability and a favorable filling property for a circuit pattern in a wiring board. The resin composition thus has an advantage of being usable in a wiring board in which the distance between conductor circuits (wirings) is narrow. The resin composition of the present embodiment is not particularly limited, but can be suitably used in a wiring board provided with a conductor circuit pattern in which at least a part of the distance between the conductor circuits is, for example, 50 µm or less.

In particular, the wiring board of the present embodiment may be a multilayer wiring board having two or more circuit layers, and the resin composition of the present embodiment can also be suitably used as an interlayer insulating material for the multilayer wiring board. The wiring board of the present embodiment is not particularly limited, but may be, for example, a multilayer wiring board, which includes two or more circuit layers and is provided with a wiring pattern in which at least a part of the distance between wirings is 50 µm or less. Furthermore, for example, a wiring pattern in which at least a part of the distance between wirings is 30 µm or less may be provided.

The resin composition of the present embodiment is not particularly limited, but is preferably used as an insulating material for the insulating layer of a high multilayer wiring board having 5 or more circuit layers, further 10 or more circuit layers. In the manufacture of a high multilayer wiring board having 5 or more circuit layers, further 10 or more circuit layers, each inner layer circuit in the multilayer forming process for forming each interlayer insulating layer can be stably embedded by using the interlayer insulating material of the present embodiment, and excellent moldability can be secured. By securing excellent moldability, it is possible to prevent isolation of the inner layer circuit and interlayer insulating layer of the multilayer wiring board on the pasted surface when a high multilayer wiring board having 5 or more circuit layers, further 10 or more circuit layers is subjected to, for example, moisture absorption and a high temperature treatment.

[Metal Foil with Resin]

Figure 4:
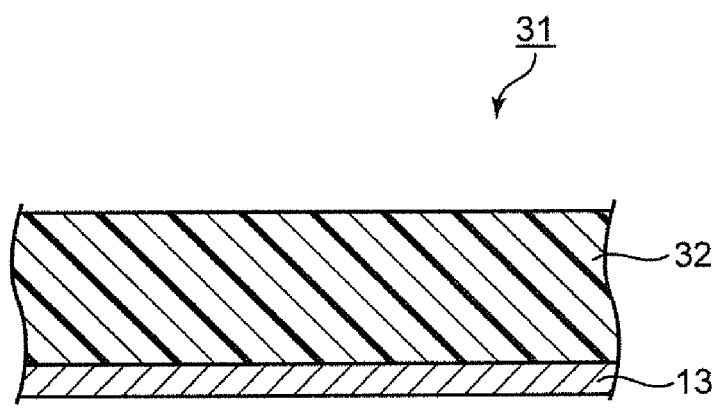
FIG. 4 is a schematic sectional view illustrating an example of a metal foil with resin according to an embodiment of the present invention.

FIG. 4 is a schematic sectional view illustrating an example of a metal foil with resin 31 according to the present embodiment.

The metal foil with resin 31 according to the present embodiment includes a resin layer 32 containing the resin composition or a semi-cured product of the resin composition and a metal foil 13 as illustrated in FIG. 4. The metal foil with resin 31 includes the metal foil 13 on the surface of the resin layer 32. In other words, the metal foil with resin 31 includes the resin layer 32 and the metal foil 13 to be laminated together with the resin layer 32. The metal foil with resin 31 may include other layers between the resin layer 32 and the metal foil 13.

The resin layer 32 may contain a semi-cured product of the resin composition as described above or may contain the uncured resin composition. In other words, the metal foil with resin 31 may be a metal foil with resin including a resin layer containing a semi-cured product of the resin composition (the B-stage resin composition) and a metal foil or a metal foil with resin including a resin layer containing the resin composition before being cured (the A-stage resin composition) and a metal foil. The resin layer is only required to contain the resin composition or a semi-cured product of the resin composition and may or may not contain a fibrous base material. The resin composition or a semi-cured product of the resin composition may be one obtained by drying or heating and drying the resin composition. As the fibrous base material, those similar to the fibrous base materials of the prepreg can be used.

As the metal foil, metal foils to be used in metal-clad laminates can be used without being limited. Examples of the metal foil include a copper foil and an aluminum foil.

The metal foil with resin 31 and a film with resin 41 may include a cover fill and the like if necessary. By including a cover film, it is possible to prevent entry of foreign matter and the like. The cover film is not particularly limited, and examples thereof include a polyolefin film, a polyester film, a polymethylpentene film, and films formed by providing a release agent layer on these films.

The method for manufacturing the metal foil with resin 31 is not particularly limited as long as the metal foil with resin 31 can be manufactured. Examples of the method for manufacturing the metal foil with resin 31 include a method in which the varnish-like resin composition (resin varnish) is applied on the metal foil 13 and heated to manufacture the metal foil with resin 31. The varnish-like resin composition is applied on the metal foil 13 using, for example, a bar coater. The applied resin composition is heated under the conditions of for example, 80° C. or more and 180° C. or less and 1 minute or more and 10 minutes or less. The heated resin composition is formed as the uncured resin layer 32 on the metal foil 13. By the heating, the organic solvent can be decreased or removed by being volatilized from the resin varnish.

The metal foil with resin including a resin layer containing the resin composition according to the present embodiment or a semi-cured product of this resin composition is a metal foil with resin suitably providing a cured product which exhibits low dielectric properties and high heat resistance and can suitably maintain the low dielectric properties even after a heat treatment and a water absorption treatment. Furthermore, the prepreg exhibits favorable moldability and also exhibits an excellent filling property into a circuit pattern when used in a wiring board and the like. For example, by laminating the metal foil with resin on a wiring board, a multilayer wiring board can be manufactured.

[Film with Resin]

Figure 5:
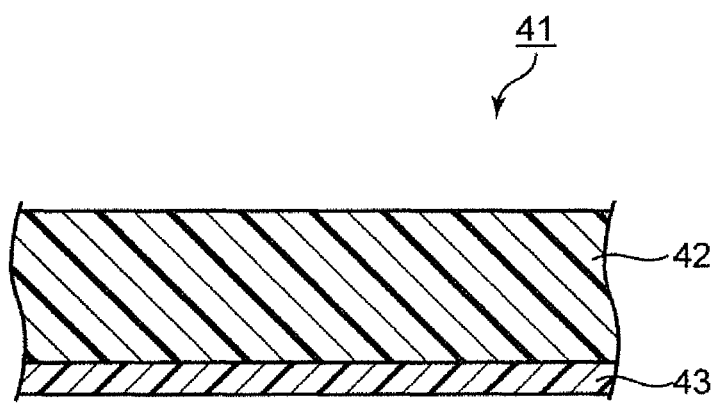
FIG. 5 is a schematic sectional view illustrating an example of a film with resin according to an embodiment of the present invention.

FIG. 5 is a schematic sectional view illustrating an example of a film with resin 41 according to the present embodiment.

The film with resin 41 according to the present embodiment includes a resin layer 42 containing the resin composition or a semi-cured product of the resin composition and a support film 43 as illustrated in FIG. 5. The film with resin 41 includes the resin layer 42 and the support film 43 to be laminated together with the resin layer 42. The film with resin 41 may include other layers between the resin layer 42 and the support film 43.

The resin layer 42 may contain a semi-cured product of the resin composition as described above or may contain the uncured resin composition. In other words, the film with resin 41 may be a film with resin including a resin layer containing a semi-cured product of the resin composition (the B-stage resin composition) and a support film or a film with resin including a resin layer containing the resin composition before being cured (the A-stage resin composition) and a support film. The resin layer is only required to contain the resin composition or a semi-cured product of the resin composition and may or may not contain a fibrous base material. The resin composition or a semi-cured product of the resin composition may be one obtained by drying or heating and drying the resin composition. As the fibrous base material, those similar to the fibrous base materials of the prepreg can be used.

As the support film 43, support films to be used in films with resin can be used without being limited. Examples of the support film include electrically insulating films such as a polyester film, a polyethylene terephthalate (PET) film, a polyimide film, a polyparabanic acid film, a polyether ether ketone film, a polyphenylene sulfide film, a polyimide film, a polycarbonate and a polyarylate film.

The film with resin 41 may include a cover film and the like if necessary. By including a cover film, it is possible to prevent entry of foreign matter and the like. The cover film is not particularly limited, and examples thereof include a polyolefin film, a polyester film, and a polymethylpentene film.

The support film and the cover film may be those subjected to surface treatments such as a matt treatment, a corona treatment, a release treatment, and a roughening treatment if necessary.

The method for manufacturing the film with resin 41 is not particularly limited as long as the film with resin 41 can be manufactured. Examples of the method for manufacturing the film with resin 41 include a method in which the varnish-like resin composition (resin varnish) is applied on the support film 43 and heated to manufacture the film with resin 41. The varnish-like resin composition is applied on the support film 43 using, for example, a bar coater. The applied resin composition is heated under the conditions of, for example, 80° C. or more and 180° C. or less and 1 minute or more and 10 minutes or less. The heated resin composition is formed as the uncured resin layer 42 on the support film 43. By the heating, the organic solvent can be decreased or removed by being volatilized from the resin varnish.

The film with resin including a resin layer containing the resin composition according to the present embodiment or a semi-cured product of this resin composition is a film with resin suitably providing a cured product which exhibits low dielectric properties and high heat resistance and can suitably maintain the low dielectric properties even after a heat treatment and a water absorption treatment. Furthermore, the prepreg exhibits favorable moldability and also exhibits an excellent filling property into a circuit pattern when used in a wiring board and the like. A multilayer wiring board can be manufactured, for example, by laminating the film with resin on a wiring board and then peeling off the support film from the film with resin or by peeling off the support film from the film with resin and then laminating the film with resin on a wiring board.

Hereinafter, the present invention will be described more specifically with reference to examples, but the scope of the present invention is not limited thereto.

EXAMPLES

Examples 1 to 15 and Comparative Examples 1 to 5

The respective components to be used when preparing a resin composition in the present examples will be described.
(Resin Component)
Polymer 1: Into a 5.0 L reactor, 2.9 mol (377 g) of divinylbenzene, 1.7 mol (224.4 g) of ethylvinylbenzene, 10.4 mol (1081.6 g) of styrene, and 15 mol (1532 g) of n-propyl acetate were introduced, 600 mmol of boron trifluoride diethyl ether complex was added thereto at 70° C., and the reaction was conducted for 4 hours. After the polymerization solution was quenched with an aqueous sodium hydrogen carbonate solution, the oil layer was washed with pure water three times, devolatilization was conducted at 60° C. under reduced pressure, and a polymer 1 was recovered and obtained.

The polymer 1, which was a polymer 1 having a structural unit represented by Formula (1) in the molecule, was an aromatic polymer having a structural unit derived from a bifunctional aromatic compound in which two carbon-carbon unsaturated double bonds are bonded to an aromatic ring, and was a compound having structural units represented by Formulas (12) to (14). The weight average molecular weight Mw is 26300. The equivalent (vinyl equivalent) of the vinyl group contained in the structural unit represented by Formula (1), where $R_1$ to $R_3$ are a hydrogen atom, is 510.

Polymer 2: Into a 5.0 L reactor, 3.6 mol (468 g) of divinylbenzene, 2.2 mol (290.4 g) of ethylvinylbenzene, 9.2 mol (956.8 g) of styrene, and 15 mol (1532 g) of n-propyl acetate were introduced, 600 mmol of boron trifluoride diethyl ether complex was added thereto at 70° C., and the reaction was conducted for 4 hours. After the polymerization solution was quenched with an aqueous sodium hydrogen carbonate solution, the oil layer was washed with pure water three times, devolatilization was conducted at 60° C. under reduced pressure, and a polymer 2 was recovered and obtained.

The polymer 2, which was a polymer 2 having a structural unit represented by Formula (1) in the molecule, was an aromatic polymer having a structural unit derived from a bifunctional aromatic compound in which two carbon-carbon unsaturated double bonds are bonded to an aromatic ring, and was a compound having structural units represented by Formulas (12) to (14). The weight average molecular weight Mw is 31100. The equivalent (vinyl equivalent) of the vinyl group contained in the structural unit represented by Formula (1), where $R_1$ to $R_3$ are a hydrogen atom, is 380.

Polymer 3: Into a 5.0 L reactor, 3.9 mol (507 g) of divinylbenzene, 2.3 mol (303.6 g) of ethylvinylbenzene, 8.8 mol (915.2 g) of styrene, and 15 mol (1532 g) of n-propyl acetate were introduced, 600 mmol of boron trifluoride diethyl ether complex was added thereto at 70° C., and the reaction was conducted for 4 hours. After the polymerization solution was quenched with an aqueous sodium hydrogen carbonate solution, the oil layer was washed with pure water three times, devolatilization was conducted at 60° C. under reduced pressure, and a polymer 3 was recovered and obtained.

The polymer 3, which was a polymer having a structural unit represented by Formula (1) in the molecule, was an aromatic polymer having a structural unit derived from a bifunctional aromatic compound in which two carbon-carbon unsaturated double bonds are bonded to an aromatic ring, and was a compound having structural units represented by Formulas (12) to (14). The weight average molecular weight Mw is 39500. The equivalent (vinyl equivalent) of the vinyl group contained in the structural unit represented by Formula (1), where $R_1$ to $R_3$ are a hydrogen atom, is 320.

The equivalent (vinyl equivalent) of the vinyl group contained in the structural unit represented by Formula (1), where $R_1$ to $R_3$ are a hydrogen atom, of the polymers 1 to 3 was calculated through iodine value measurement by the Wyeth method. Specifically, the compound to be measured was first dissolved in chloroform so that the concentration was 0.3 g/30 mL. Excess amount of iodine chloride was added to the double bonds present in this solution. By doing so, the double bond was reacted with iodine chloride, this reaction was allowed to proceed sufficiently, and then an aqueous potassium iodide solution at 20% by mass was added to the solution after being subjected to the reaction to extract the iodine component remaining in the solution after being subjected to the reaction into the aqueous phase in the form of $I_3^-$. This aqueous phase into which $I_3^-$ was extracted was titrated with an aqueous sodium thiosulfate solution (0.1 mol/L sodium thiosulfate standard solution), and the iodine value was calculated. The following equation was used to calculate the iodine value.

Iodine value=[(B−A)×F×1.269]/mass of compound(g)

In the equation, B denotes the titration volume (cc) of the 0.1 mol/L sodium thiosulfate standard solution required for the blank test, A denotes the titration volume (cc) of 0.1 mol/L sodium thiosulfate standard solution required for neutralization, and F denotes the titer of sodium thiosulfate.

Modified PPE: Modified polyphenylene ether obtained by reacting polyphenylene ether with chloromethylstyrene. Specifically, this is a modified polyphenylene ether obtained by conducting reaction as follows.

First, 200 g of polyphenylene ether (SA90 manufactured by SABIC Innovative Plastics, number of terminal hydroxyl groups: 2, weight average molecular weight Mw: 1700), 30 g of a mixture containing p-chloromethylstyrene and m-chloromethylstyrene at a mass ratio of 50:50 (chloromethylstyrene: CMS manufactured by Tokyo Chemical industry Co., Ltd.), 1.227 g of tetra-n-butylammonium bromide as a phase transfer catalyst, and 400 g of toluene were introduced into a 1-liter three-necked flask equipped with a temperature controller, a stirrer, cooling equipment, and a dropping funnel and stirred. Moreover, the mixture was stirred until polyphenylene ether, chloromethylstyrene, and tetra-n-butylammonium bromide were dissolved in toluene. At that time, the mixture was gradually heated until the liquid temperature finally reached 75° C. Thereafter, an aqueous sodium hydroxide solution (20 g of sodium hydroxide/20 g of water) as an alkali metal hydroxide was added dropwise to the solution over 20 minutes. Thereafter, the mixture was further stirred at 75° C. for 4 hours. Next, the resultant in the flask was neutralized with hydrochloric acid at 10% by mass and then a large amount of methanol was added into the flask. By doing so, a precipitate was generated in the liquid in the flask. In other words, the product contained in the reaction solution in the flask was reprecipitated. Thereafter, this precipitate was taken out by filtration, washed three times with a mixed solution of methanol and water contained at a mass ratio of 80:20, and then dried under reduced pressure at 80° C. for 3 hours.

The obtained solid was analyzed by $^1$H-NMR (400 MHz, CDCl$_3$, TMS). As a result of NMR measurement, a peak attributed to a vinylbenzyl group (ethenylbenzyl group) was observed at 5 to 7 ppm. This made it possible to confirm that the obtained solid was a modified polyphenylene ether compound having a vinylbenzyl group (ethenylbenzyl group) as the substituent at the molecular terminal in the molecule. Specifically, it was confirmed that the obtained solid was ethenylbenzylated polyphenylene ether. This obtained modified polyphenylene ether compound was a modified polyphenylene ether compound represented by Formula (18), where Y was a dimethylmethylene group (a group represented by Formula (16), where $R_{33}$ and $R_{34}$ were a methyl group), Z was a phenylene group, $R_1$ to $R_3$ were a hydrogen atom, n was 1, and p was 1.

The number of terminal functional groups in the modified polyphenylene ether was measured as follows.

First, the modified polyphenylene ether was accurately weighed. The weight at that time is defined as X (mg). Thereafter, this modified polyphenylene ether weighed was dissolved in 25 mL of methylene chloride, 100 μL of an ethanol solution of tetraethylammonium hydroxide (TEAH) at 10% by mass (TEAH:ethanol (volume ratio)=15:85) was added to the solution, and then the absorbance (Abs) of this mixture at 318 nm was measured using a UV spectrophotometer (UV-1600 manufactured by Shimadzu Corporation). Thereafter, the number of terminal hydroxyl groups in the modified polyphenylene ether was calculated from the measurement result using the following equation.

Residual OH amount(μmol/g)=[(25×Abs)/(ε×OPL×X)]×10$^6$

Here, ε indicates the extinction coefficient and is 4700 L/mol·cm. OPL indicates the cell path length and is 1 cm.

Since the calculated residual OH amount (the number of terminal hydroxyl groups) in the modified polyphenylene ether is almost zero, it was found that the hydroxyl groups in the polyphenylene ether before being modified are almost modified. From this fact, it was found that the number of terminal hydroxyl groups decreased from the number of terminal hydroxyl groups in polyphenylene ether before being modified is the number of terminal hydroxyl groups in polyphenylene ether before being modified. In other words, it was found that the number of terminal hydroxyl groups in polyphenylene ether before being modified is the number of terminal functional groups in the modified polyphenylene ether. In other words, the number of terminal functional groups was two.

In addition, the intrinsic viscosity (IV) of the modified polyphenylene ether was measured in methylene chloride at 25° C. Specifically, the intrinsic viscosity (IV) of the modified polyphenylene ether was measured in a methylene chloride solution (liquid temperature: 25° C.) of the modified polyphenylene ether at 0.18 g/45 ml using a viscometer (AVS500 Visco System manufactured by SCHOTT Instruments GmbHt). As a result, the intrinsic viscosity (IV) of the modified polyphenylene ether was 0.086 dl/g.

The molecular weight distribution of the modified polyphenylene ether was measured by GPC. Moreover, the weight average molecular weight (Mw) was calculated from the obtained molecular weight distribution. As a result, Mw was 2,300.

(Curing Agent)
Acenaphthylene: Acenaphthylene (manufactured by HE Chemical Corporation)
Maleimide compound: N-Phenylmonomaleimide (manufactured by NIPPON SHOKUBAI CO., LTD.)

(Reaction Initiator)
Azo-based initiator: "VR-110" (manufactured by FUJIFILM Wako Pure Chemical Corporation)
Peroxide initiator: PBP (1,3-bis(butylperoxyisopropyl) benzene; PERBUTYL P manufactured by NOF Corporation)

(Free Radical Compound)
Free radical compound 1: Free radical compound represented by the following formula ("H0865" manufactured by Tokyo Chemical Industry Co., Ltd.)

[Chemical formula. 27]

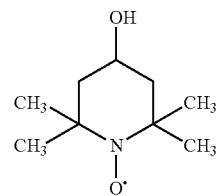

Free radical compound 2: Free radical compound represented by the following formula ("T3751" manufactured by Tokyo Chemical Industry Co., Ltd.)

[Chemical formula. 28]

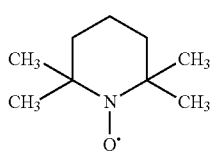

Free radical compound 3: Free radical compound represented by the following formula ("H0878" manufactured by Tokyo Chemical Industry Co., Ltd.)

[Chemical formula. 29]

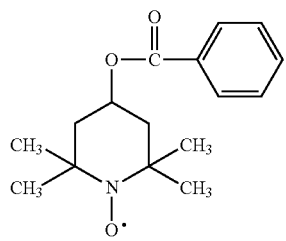

Free radical compound 4: Free radical compound represented by the following formula ("B5642" manufactured by Tokyo Chemical Industry Co., Ltd.)

[Chemical formula. 30]

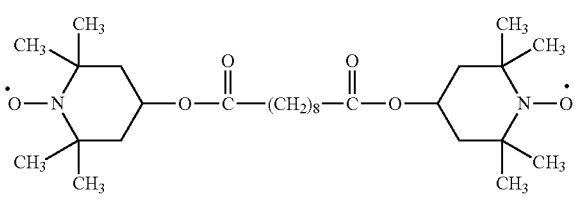

Free radical compound 5: Free radical compound represented by the following formula ("C1406" manufactured by Tokyo Chemical Industry Co., Ltd.)

[Chemical formula. 31]

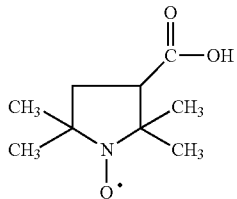

Free radical compound 6: Free radical compound represented by the following formula ("D4313" manufactured by Tokyo Chemical Industry Co., Ltd.)

[Chemical formula. 32]

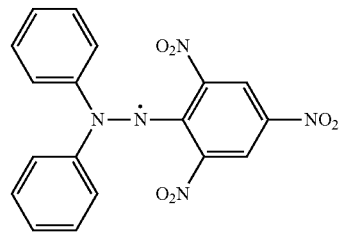

Free radical compound 7: Free radical compound represented by the following formula ("G0020" manufactured by Tokyo Chemical Industry Co., Ltd.)

[Chemical formula. 33]

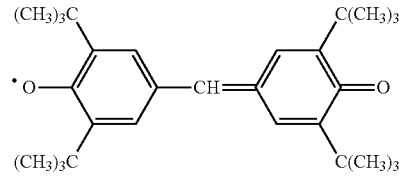

(Catechol Compound)
 4-tert-Butylcatechol: 4-tert-Butylcatechol (manufactured by Tokyo Chemical Industry Co., Ltd.)
(Inorganic Filler)
 Silica filler 1: "SC-2300SVJ" (manufactured by Admatechs Company Limited; silica having a silanol group content of 4.0%)
 Silica filler 2: "5SV-C" (manufactured by Admatechs Company Limited; silica having a silanol group content of 1.0%©)
(Preparation Method)
 First, the respective components other than the inorganic filler were added to and mixed in toluene at the compositions (parts by mass) presented in Table 3 so that the solid concentration was 55% by mass. The mixture was stirred for 60 minutes. Thereafter, the inorganic filler was added to and dispersed in the obtained liquid using a bead mill. By doing so, a varnish-like resin composition (varnish) was obtained.
[Melt Viscosity]
 A measurement sample was obtained by pressing 0.5 g of the powdered semi-cured product of the resin composition obtained from the prepreg into pellets having a diameter of 1.0 cm and a height of 0.5 cm at a pressure of 2.8 MPa. The melting behavior of the measurement sample was measured using a dynamic viscoelasticity measuring instrument Rheosol-G3000NT. As the measurement conditions, the sample temperature was raised at 4 degrees per minute, and the viscosity (poise) of the sample at that time was measured. The temperature when the measured value of viscosity decreased most in the temperature raising process from the semi-cured state (B-stage) to the cured state (C-stage) was taken as the minimum melt viscosity (T2).
[T1/T2]
 The melt viscosity when the temperature was raised from the minimum melt viscosity (T2) by +10° C. was taken as T1, and T1/T2 was determined. T1/T2 is an index to measure the curing speed from the state where the semi-cured product once became T2 (the state where the viscosity is the lowest) in the temperature raising process. As the T1/T2 value is smaller, the curing speed is slower, and this is considered to be one of the characteristics of the resin composition exhibiting high moldability.

Next, an evaluation substrate (cured product of prepreg) was obtained as follows.

The obtained varnish was impregnated into a fibrous base material (glass cloth: 1078L, #1078 type, L Glass manufactured by Asahi Kasei Corporation) and then heated and dried at 120° C. for 3 minutes, thereby fabricating a prepreg. At that time, the content (resin content) of the components constituting the resin with respect to the prepreg was adjusted to be 67% by mass by the curing reaction. Thereafter, each of the obtained prepregs was stacked by two sheets and the stacked body was heated and pressed under the conditions of 200° C., 2 hours, and a pressure of 3 MPa, thereby obtaining an evaluation substrate (cured product of prepreg).

Next, an evaluation substrate (metal-clad laminate) was obtained as follows.

Next, the obtained varnish was impregnated into a fibrous base material (glass cloth: GC1078L, #1078 type, L Glass manufactured by Asahi Kasei Corporation) and then heated and dried at 120° C. for 3 minutes, thereby fabricating a prepreg. At that time, the content (resin content) of the components constituting the resin with respect to the prepreg was adjusted to be 67% by mass by the curing reaction.

Each of the obtained prepregs was stacked by two sheets, and a copper foil (FV-WS manufactured by FURUKAWA ELECTRIC CO., LTD., thickness: 18 µm) was disposed on both sides of the stacked body to form a body to be pressed, and the body to be pressed was heated and pressed under the conditions of 200° C. and a pressure of 3 MPa for 2 hours, thereby fabricating a copper foil-clad laminate, which was an evaluation substrate (metal-clad laminate) in which a copper foil was pasted to both surfaces.

The evaluation substrates (cured product of prepreg and metal-clad laminate) prepared as described above were evaluated by the methods described below.

[Moldability]

A cured product having a copper pattern of 200 mm×200 mm on a lattice having a residual copper ratio of 80% and a same line thickness of 35 µm was prepared. A 200 mm×200 mm prepreg was stacked on top of the cured product. A 250 mm×250 mm copper foil having a thickness of 35 µm was stacked on top of the prepreg. These were sandwiched between metal plates having a thickness of about 3 mm, and heating and pressing were conducted using a pressing machine for laminating molding under the conditions described below. As the heating conditions, the temperature was raised from 30 degrees to 200 degrees at 4 degrees per minute. As the pressing conditions, the pressure applied to the prepreg was set to 1 MPa at the start of heating, and then the pressure applied to the prepreg was set to 3 MPa when the temperature reached 110° C. to cure the prepreg.

As a result, it was evaluated as "good" when a gap was not generated between the lattice pattern and the cured product but the cured product was filled in the lattice pattern, and it was evaluated as "poor" when a gap was generated. The presence or absence of a gap was determined by whether or not a gap that looked whitish was confirmed when the copper foil of the cured product fabricated using the pressing machine for laminating molding was removed and light was transmitted from the other surface.

[Dielectric Loss Tangent Before Moisture Absorption Treatment]

The dielectric loss tangent of the evaluation substrate (cured product of prepreg) at 10 GHz was measured by the cavity resonator perturbation method. Specifically, the dielectric loss tangent of the evaluation substrate at 10 GHz was measured using a network analyzer (N5230A manufactured by Keysight Technologies).

[Dielectric Loss Tangent after Moisture Absorption Treatment]

The evaluation substrate used in the measurement of the dielectric loss tangent before a water absorption treatment was subjected to a moisture absorption treatment with reference to JIS C 6481 (1996), and the dielectric loss tangent (dielectric loss tangent after moisture absorption) of this evaluation substrate subjected to the moisture absorption treatment was measured by a method similar to that for the measurement of the dielectric loss tangent before the moisture absorption treatment. As the moisture absorption treatment, the evaluation substrate was treated for 120 hours in an environment with a temperature of 85° C. and a humidity of 85%, then the moisture on the evaluation substrate was thoroughly wiped off with a dry and clean cloth, and the measurement was performed.

[Amount of Change in Dielectric Loss Tangent (after Moisture Absorption Treatment–Before Moisture Absorption Treatment)]

The difference between the dielectric loss tangent before a moisture absorption treatment and the dielectric loss tangent after a moisture absorption treatment (dielectric loss tangent after moisture absorption treatment–dielectric loss tangent before moisture absorption treatment) was calculated.

[Dielectric Loss Tangent Before Heat Treatment]

The dielectric loss tangent of the evaluation substrate at 10 GHz was measured by the cavity resonator perturbation method. Specifically, the dielectric loss tangent of the evaluation substrate at 10 GHz was measured using a network analyzer (N5230A manufactured by Keysight Technologies).

[Dielectric Loss Tangent after Heat Treatment]

The evaluation substrate used in the measurement of the dielectric loss tangent before a heat treatment was held (heat-treated) for 120 hours under a condition of 130° C., and the dielectric loss tangent (dielectric loss tangent after heat treatment) of this evaluation substrate subjected to the heat treatment was measured by a method similar to that for the measurement of the dielectric loss tangent before the heat treatment.

[Amount of change in dielectric loss tangent (after heat treatment–before heat treatment)] The difference between the dielectric loss tangent before a heat treatment and the dielectric loss tangent after a heat treatment (=dielectric loss tangent after heat treatment–dielectric loss tangent before heat treatment) was calculated.

[Glass transition temperature (DMA) (Tg)] The Tg of the cured product was measured using a viscoelastic spectrometer "DMS6100" manufactured by Seiko Instruments Inc. At this time, a dynamic viscoelasticity measurement (DMA) was performed at a bending module by setting the frequency to 10 Hz, and the temperature at which tan & was the maximum when the temperature was raised from room temperature to 320° C. under the condition of a rate of temperature rise of PC/min was defined as Tg.

The results of the respective evaluations are presented in Table 3.

TABLE 3

| | | | Example | | | | | | |
|---|---|---|---|---|---|---|---|---|---|
| | | | 1 | 2 | 3 | 4 | 5 | 6 | 7 |
| Composition (parts by mass) | Resin component | Polymer 1 | 75 | | | | | | |
| | | Polymer 2 | | 75 | — | 75 | 75 | 75 | 75 |
| | | Polymer 3 | | | 75 | | | | |
| | | Modified PPE | | | | | | | |
| | Curing agent | Acenaphthylene | 25 | 25 | 25 | 25 | | | |
| | | N-Phenyl-monomaleimide | | | | | 25 | 25 | 25 |
| | Reaction initiator | Azo-based initiator | | | | | | | |
| | | Peroxide initiator | | | | | | | |
| | Free radical compound | Free radical compound 1 | 0.2 | 0.2 | 0.2 | 0.1 | 0.2 | 0.2 | 0.2 |
| | | Free radical compound 2 | | | | | | | |
| | | Free radical compound 3 | | | | | | | |
| | | Free radical compound 4 | | | | | | | |
| | | Free radical compound 5 | | | | | | | |
| | | Free radical compound 6 | | | | | | | |
| | | Free radical compound 7 | | | | | | | |
| | Catechol compound | 4-tert-Butylcatechol | | | | | | | |
| | Inorganic filler | Silica filler 1 | 60 | 60 | 60 | 60 | 60 | | |
| | | Silica filler 2 | | | | | | 60 | 100 |
| T2 [poise] | | | 1440 | 1440 | 1440 | 1840 | 1400 | 1460 | 12000 |
| T1 [poise] | | | 1760 | 1760 | 1800 | 3640 | 1680 | 1800 | 16000 |
| T1/T2 | | | 1.2 | 1.2 | 1.3 | 2.0 | 1.2 | 1.2 | 1.3 |
| Moldability | | | good | good | good | good | good | good | good |
| Dielectric loss tangent before moisture absorption (85° C./85%_120 h) treatment | | | 0.0019 | 0.0019 | 0.0019 | 0.0019 | 0.0019 | 0.0016 | 0.0019 |
| Dielectric loss tangent after moisture absorption (85° C./85%_120 h) treatment | | | 0.0027 | 0.0027 | 0.0027 | 0.0028 | 0.0028 | 0.0023 | 0.0025 |
| Amount of change in dielectric loss tangent (after water absorption treatment − before water absorption treatment) | | | 0.0008 | 0.0008 | 0.0008 | 0.0009 | 0.0009 | 0.0007 | 0.0006 |
| Dielectric loss tangent before heat (130° C._120 h) treatment | | | 0.0019 | 0.0019 | 0.0019 | 0.0019 | 0.0019 | 0.0016 | 0.0019 |
| Dielectric loss tangent after heat (130° C._120 h) treatment | | | 0.0023 | 0.0024 | 0.0024 | 0.0028 | 0.0024 | 0.0019 | 0.0021 |
| Amount of change in dielectric loss tangent (after heat treatment − before heat treatment) | | | 0.0004 | 0.0005 | 0.0005 | 0.0009 | 0.0005 | 0.0003 | 0.0002 |
| Tg DMA [° C.] | | | 212 | 215 | 218 | 215 | 215 | 212 | 210 |

| | | | Example | | | | | | |
|---|---|---|---|---|---|---|---|---|---|
| | | | 8 | 9 | 10 | 11 | 12 | 13 | 14 |
| Composition (parts by mass) | Resin component | Polymer 1 | | | | | | | |
| | | Polymer 2 | 65 | 75 | 75 | 75 | 75 | 75 | 75 |
| | | Polymer 3 | | | | | | | |
| | | Modified PPE | 10 | | | | | | |
| | Curing agent | Acenaphthylene | 25 | 25 | 25 | 25 | 25 | 25 | 25 |
| | | N-Phenylmono-maleimide | | | | | | | |
| | Reaction initiator | Azo-based initiator | | | | | | | |
| | | Peroxide initiator | | | | | | | |
| | Free radical compound | Free radical compound 1 | 0.2 | | | | | | |
| | | Free radical compound 2 | | 0.2 | | | | | |
| | | Free radical compound 3 | | | 0.2 | | | | |
| | | Free radical compound 4 | | | | 0.2 | | | |
| | | Free radical compound 5 | | | | | 0.2 | | |

TABLE 3-continued

|  |  |  |  |  |  |  |  |  |  |
|---|---|---|---|---|---|---|---|---|---|
|  |  | Free radical compound 6 |  |  |  |  |  | 0.2 |  |
|  |  | Free radical compound 7 |  |  |  |  |  |  | 0.2 |
|  | Catechol compound | 4-tert-Butylcatechol |  |  |  |  |  |  |  |
|  | Inorganic filler | Silica filler 1 |  | 60 | 60 | 60 | 60 | 60 | 60 |
|  |  | Silica filler 2 | 100 |  |  |  |  |  |  |
|  | T2 [poise] |  | 10000 | 1360 | 3520 | 3400 | 1520 | 5600 | 2600 |
|  | T1 [poise] |  | 14000 | 1760 | 5600 | 4800 | 1800 | 9600 | 3120 |
|  | T1/T2 |  | 1.4 | 1.3 | 1.6 | 1.4 | 1.2 | 1.7 | 1.2 |
|  | Moldability |  | good | good | good | good | good | good | good |
|  | Dielectric loss tangent before moisture absorption (85° C./85%_120 h) treatment |  | 0.0020 | 0.0019 | 0.0019 | 0.0019 | 0.0020 | 0.0020 | 0.0022 |
|  | Dielectric loss tangent after moisture absorption (85° C./85%_120 h) treatment |  | 0.0027 | 0.0027 | 0.0027 | 0.0027 | 0.0028 | 0.0028 | 0.0029 |
|  | Amount of change in dielectric loss tangent (after water absorption treatment − before water absorption treatment) |  | 0.0007 | 0.0008 | 0.0008 | 0.0008 | 0.0008 | 0.0008 | 0.0007 |
|  | Dielectric loss tangent before heat (130° C._120 h) treatment |  | 0.0020 | 0.0019 | 0.0019 | 0.0019 | 0.0020 | 0.0020 | 0.0022 |
|  | Dielectric loss tangent after heat (130° C._120 h) treatment |  | 0.0023 | 0.0024 | 0.0025 | 0.0024 | 0.0025 | 0.0023 | 0.0032 |
|  | Amount of change in dielectric loss tangent (after heat treatment − before heat treatment) |  | 0.0003 | 0.0005 | 0.0006 | 0.0005 | 0.0005 | 0.0003 | 0.0010 |
|  | Tg DMA [° C.] |  | 220 | 215 | 215 | 215 | 215 | 210 | 200 |

|  |  |  | Example | | | Comparative Example | | | |
|---|---|---|---|---|---|---|---|---|---|
|  |  |  | 15 | 16 | 17 | 1 | 2 | 3 | 4 |
| Composition (parts by mass) | Resin component | Polymer 1 |  |  |  |  |  |  |  |
|  |  | Polymer 2 | 75 | 75 | 75 | 75 | 75 | 75 | 75 |
|  |  | Polymer 3 |  |  |  |  |  |  |  |
|  |  | Modified PPE |  |  |  |  |  |  |  |
|  | Curing agent | Acenaphthylene | 25 | 25 | 25 | 25 | 25 | 25 | 25 |
|  |  | N-Phenylmono-maleimide |  |  |  |  |  |  |  |
|  | Reaction initiator | Azo-based initiator | 1.0 | 1.0 |  |  | 1.0 |  |  |
|  |  | Peroxide initiator |  |  | 1.0 |  |  |  | 1.0 |
|  | Free radical compound | Free radical compound 1 | 0.2 | 0.1 | 0.2 |  |  |  |  |
|  |  | Free radical compound 2 |  |  |  |  |  |  |  |
|  |  | Free radical compound 3 |  |  |  |  |  |  |  |
|  |  | Free radical compound 4 |  |  |  |  |  |  |  |
|  |  | Free radical compound 5 |  |  |  |  |  |  |  |
|  |  | Free radical compound 6 |  |  |  |  |  |  |  |
|  |  | Free radical compound 7 |  |  |  |  |  |  |  |
|  | Catechol compound | 4-tert-Butylcatechol |  |  |  |  | 0.2 |  |  |
|  | Inorganic filler | Silica filler 1 | 60 | 60 | 60 | 60 | 60 | 60 | 60 |
|  |  | Silica filler 2 |  |  |  |  |  |  |  |
|  | T2 [poise] |  | 7200 | 7600 | 8000 | 3960 | 1500 | 8000 | 10000 |
|  | T1 [poise] |  | 8800 | 9200 | 10000 | 38500 | 1800 | 61000 | 64000 |
|  | T1/T2 |  | 1.2 | 1.2 | 1.3 | 9.7 | 1.2 | 7.6 | 6.4 |
|  | Moldability |  | good | good | good | poor | good | poor | poor |
|  | Dielectric loss tangent before moisture absorption (85° C./85%_120 h) treatment |  | 0.0019 | 0.0019 | 0.0023 | 0.0019 | 0.0020 | 0.0019 | 0.0023 |
|  | Dielectric loss tangent after moisture absorption (85° C./85%_120 h) treatment |  | 0.0028 | 0.0029 | 0.0031 | 0.0031 | 0.0032 | 0.0031 | 0.0033 |
|  | Amount of change in dielectric loss tangent (after water absorption treatment − before water absorption treatment) |  | 0.0009 | 0.0010 | 0.0008 | 0.0012 | 0.0012 | 0.0012 | 0.0010 |

TABLE 3-continued

| | | | | | | | |
|---|---|---|---|---|---|---|---|
| Dielectric loss tangent before heat (130° C._120 h) treatment | 0.0019 | 0.0019 | 0.0023 | 0.0019 | 0.0020 | 0.0019 | 0.0023 |
| Dielectric loss tangent after heat (130° C._120 h) treatment | 0.0027 | 0.0029 | 0.0024 | 0.0034 | 0.0034 | 0.0034 | 0.0036 |
| Amount of change in dielectric loss tangent (after heat treatment − before heat treatment) | 0.0008 | 0.0010 | 0.0001 | 0.0015 | 0.0014 | 0.0015 | 0.0013 |
| Tg DMA [° C.] | 220 | 220 | 250 | 215 | 180 | 220 | 250 |

<Discussion>

As can be seen from Table 3, in all of Examples using the resin composition of the present invention, it was confirmed that it is possible to provide a resin composition, which exhibits moldability to be applicable to a laminated wiring board and can provide a cured product which exhibits low dielectric properties and high heat resistance and is hardly affected by changes in the external environment, and the like.

On the other hand, in Comparative Examples 1 to 3 not containing a free radical compound, the cured product was affected by changes in the external environment and was not able to maintain the low dielectric properties. In Comparative Example 1 not containing both a free radical compound and a reaction initiator, curing started promptly after minimum melting and, as a result, the moldability was inferior. In Comparative Examples 2 and 3 as well, curing proceeded promptly after minimum melting by the effect of reaction initiator addition and, as a result, the moldability was inferior as in Comparative Example 1.

This application is based on Japanese Patent Application No. 2019-177945 filed on Sep. 27, 2019, the contents of which are included in the present application.

In order to express the present invention, the present invention is described above appropriately and sufficiently through the embodiments with reference to specific examples, drawings and the like. However, it should be recognized by those skilled in the art that changes and/or improvements of the above-described embodiments can be readily made. Accordingly, changes or improvements made by those skilled in the art shall be construed as being included in the scope of the claims unless otherwise the changes or improvements are at the level which departs from the scope of the appended claims.

INDUSTRIAL APPLICABILITY

The present invention has a wide range of industrial applicability in the technical field relating to electronic materials and various devices using the same.

The invention claimed is:

1. A resin composition comprising:

a polymer having a structural unit represented by the following Formula (1) in a molecule; and a free radical compound, wherein the free radical compound has at least one free radical group selected from the group consisting of structures represented by the following Formulas (2), (3), (4) and (5) in a molecule:

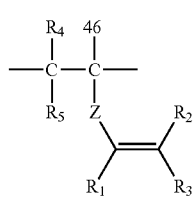

(1)

wherein in Formula (1), Z represents an arylene group, $R_1$ to $R_3$ each independently represent a hydrogen atom or an alkyl group, and $R_4$ to $R_6$ each independently represent a hydrogen atom or an alkyl group having 1 to 6 carbon atoms;

(2)

(3)

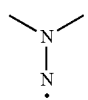

(4)

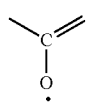

(5)

and wherein the free radical compound includes at least one compound selected from compounds represented by the following Formulas (6) to (8):

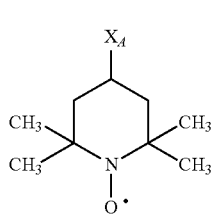

(6)

-continued

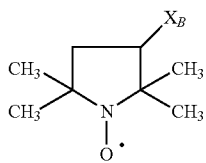
(7)

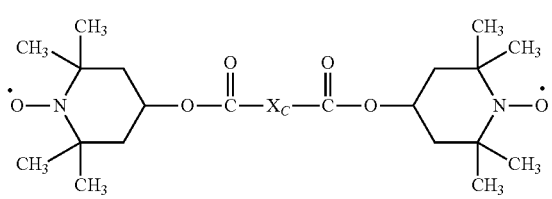
(8)

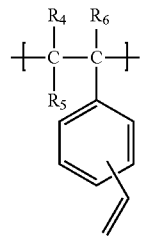
(10)

wherein in Formula (10), $R_4$ to $R_6$ each independently represent a hydrogen atom or an alkyl group having 1 to 6 carbon atoms.

4. The resin composition according to claim 1, wherein the polymer includes a polymer having a structural unit represented by the following Formula (11) in a molecule:

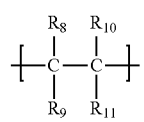
(11)

wherein in Formula (11), $R_8$ to $R_{10}$ each independently represent a hydrogen atom or an alkyl group having 1 to 6 carbon atoms and $R_{11}$ represents an aryl group).

5. The resin composition according to claim 4, wherein the aryl group in the structural unit represented by Formula (11) includes an aryl group having an alkyl group having 1 to 6 carbon atoms.

6. The resin composition according to claim 1, wherein a weight average molecular weight of the polymer is 1,500 to 40,000.

7. The resin composition according to claim 1, wherein an equivalent of a vinyl group contained in the structural unit represented by Formula (1), where $R_1$ to $R_3$ are a hydrogen atom, of the polymer is 250 to 1200.

8. The resin composition according to claim 1, further comprising a curing agent.

9. The resin composition according to claim 8, wherein a content of the free radical compound is 0.01 to 0.4 parts by mass with respect to 100 parts by mass of a sum of the polymer and the curing agent.

10. The resin composition according to claim 8, wherein the curing agent contains at least one selected from the group consisting of a polyfunctional acrylate compound having two or more acryloyl groups in a molecule, a polyfunctional methacrylate compound having two or more methacryloyl groups in a molecule, a polyfunctional vinyl compound having two or more vinyl groups in a molecule, a styrene derivative, an allyl compound having an allyl group in a molecule, a maleimide compound having a maleimide group in a molecule, and an acenaphthylene compound having an acenaphthylene structure in a molecule.

wherein in Formula (6), $X_A$ represents an amino group, a cyano group, a hydroxy group, an isothiocyanate, a methoxy group, a carboxy group, an amide group, or a benzoyloxy group, in Formula (7), $X_B$ represents a hydrogen atom, an amino group, a cyano group, a hydroxy group, an isothiocyanate, a methoxy group, a carboxy group, an amide group, or a benzoyloxy group, in Formula (8), $X_C$ represents an alkylene group, an aromatic structure, a carbonyl group, or an ether bond, and when the cured product of the resin composition is heat-treated for 120 hours at 130° C., a difference of (a dielectric loss tangent of the cured product after heat treatment)−(a dielectric loss tangent of the cured product before heat treatment) is 0.0010 or less.

2. The resin composition according to claim 1, wherein the structural unit represented by Formula (1) includes a structural unit represented by the following Formula (9):

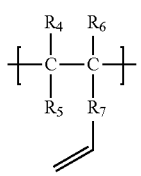
(9)

wherein in Formula (9), $R_4$ to $R_6$ each independently represent a hydrogen atom or an alkyl group having 1 to 6 carbon atoms and $R_7$ represents an arylene group having 6 to 12 carbon atoms.

3. The resin composition according to claim 2, wherein the structural unit represented by Formula (9) includes a structural unit represented by the following Formula (10):

11. The resin composition according to claim 1, further comprising a reaction initiator.

12. The resin composition according to claim 11, wherein the reaction initiator contains at least one selected from a metal peroxide, an azo compound, or an organic peroxide.

13. The resin composition according to claim 11, wherein a content of the reaction initiator is 0.5 to 8.0 parts by mass with respect to 100 parts by mass of a sum of the polymer and the curing agent.

14. The resin composition according to claim 11, wherein a proportion (mass ratio) of the free radical compound to the reaction initiator is 0.005:1 to 0.2:1.0.

15. The resin composition according to claim 1, further comprising an inorganic filler.

16. The resin composition according to claim 1, further comprising a modified polyphenylene ether compound of which a terminal is modified with a substituent having a carbon-carbon unsaturated double bond.

17. A prepreg comprising:
the resin composition according to claim 1 or a semi-cured product of the resin composition; and
a fibrous base material.

18. A film with resin comprising:
a resin layer containing the resin composition according to claim 1 or a semi-cured product of the resin composition; and
a support film.

19. A metal foil with resin comprising:
a resin layer containing the resin composition according to claim 1 or a semi-cured product of the resin composition; and
a metal foil.

20. A metal-clad laminate comprising:
an insulating layer containing a cured product of the resin composition according to claim 1; and
a metal foil.

21. A wiring board comprising:
an insulating layer containing a cured product of the resin composition according to claim 1; and
wiring.

22. The wiring board according to claim 21, comprising a plurality of the insulating layers,
wherein the wiring is disposed between the insulating layers.

23. The resin composition according to claim 1, wherein T1/T2 is 5.0 or less, where T2 denotes a lowest melt viscosity and T1 denotes a melt viscosity at a temperature higher than a temperature having the lowest melt viscosity by 10° C.

24. The resin composition according to claim 23, wherein T2 is 14000 (poise) or less and T1 is 15000 (poise) or less.

* * * * *